(12) United States Patent
Matsumura et al.

(10) Patent No.: US 7,227,879 B2
(45) Date of Patent: Jun. 5, 2007

(54) NITRIDE SEMICONDUCTOR LASER DEVICE HAVING CURRENT BLOCKING LAYER AND METHOD OF MANUFACTURING THE SAME

(75) Inventors: Hiroaki Matsumura, Anan (JP); Tomoya Yanamono, Anan (JP)

(73) Assignee: Nichia Corporation, Tokushima (JP)

( * ) Notice: Subject to any disclaimer, the term of this patent is extended or adjusted under 35 U.S.C. 154(b) by 400 days.

(21) Appl. No.: 10/876,695

(22) Filed: Jun. 28, 2004

(65) Prior Publication Data
US 2004/0264533 A1 Dec. 30, 2004

(30) Foreign Application Priority Data
Jun. 27, 2003 (JP) .......................... P 2003-184812
Jul. 10, 2003 (JP) .......................... P 2003-272832

(51) Int. Cl.
*H01S 5/00* (2006.01)
(52) U.S. Cl. ................ 372/45.01; 372/46.01
(58) Field of Classification Search ............. 372/45.01, 372/46.01, 43.01, 75
See application file for complete search history.

(56) References Cited

U.S. PATENT DOCUMENTS 4,964,135 A 10/1990 Mitsui et al.
6,256,330 B1 * 7/2001 LaComb .................. 372/46.01
6,661,822 B1 * 12/2003 Kubota et al. ........... 372/46.01
6,751,246 B2 * 6/2004 Bouadma ................. 372/46.01
2001/0012308 A1 8/2001 Fukunaga
2001/0043634 A1 11/2001 Arakida et al.
2002/0150136 A1 10/2002 Watanabe et al.

FOREIGN PATENT DOCUMENTS

| DE | 208 432 | 5/1984 |
| JP | 10-27947 | 1/1998 |
| JP | 2001-15860 | 1/2001 |
| JP | 2002-9398 | 1/2002 |
| JP | 2002-314203 | 10/2002 |
| WO | 2002/103813 | 12/2002 |

* cited by examiner

*Primary Examiner*—Minsun Oh Harvey
*Assistant Examiner*—Tuan N. Nguyen
(74) *Attorney, Agent, or Firm*—Wenderoth, Lind & Ponack, L.L.P.

(57) ABSTRACT

A nitride semiconductor laser including a laminate that includes an n-side semiconductor layer, an active layer and a p-side semiconductor layer, the n-side semiconductor layer or p-side semiconductor layer including a current blocking layer 30 that is made of $In_xAl_yGa_{1-x-y}N$ ($0 \leq x \leq 0.1$, $0.5 \leq y \leq 1$, $0.5 \leq x+y \leq 1$) and has a stripe-shaped window 32 formed therein to pass current flow.

29 Claims, 13 Drawing Sheets

NITRIDE SEMICONDUCTOR LASER DEVICE HAVING CURRENT BLOCKING LAYER AND METHOD OF MANUFACTURING THE SAME

BACKGROUND OF THE INVENTION

1. Field of the Invention

The present invention relates to a nitride semiconductor laser device having an active layer made of gallium nitride semiconductor, particularly to a nitride semiconductor laser device having a current blocking layer made of $In_xAl_yGa_{1-x-y}N$ ($0 \leq x \leq 0.1$, $0.5 \leq y \leq 1$, $0.5 \leq x+y \leq 1$).

2. Prior Art

Gallium nitride semiconductor laser is capable of oscillating in a wide range of wavelengths from ultraviolet to red light, and is expected to have variety of applications such as light sources for optical disk system, laser printer and optical network. In the gallium nitride semiconductor laser of the prior art, it has been a common practice to employ ridge waveguide structure that has stripe-shaped ridge formed on a cladding layer or the like located on an active layer, for the stripe structure formed to control the horizontal transverse oscillation mode.

However, since mechanical strength of the ridge waveguide structure is weak at the ridge, defects are likely to occur particularly when mounted face down. Also because variations are caused in the threshold current and/or beam shape depending on the dimensions of the ridge, it is difficult to manufacture laser devices of uniform characteristics. For this reason, attempts have been made to control the horizontal transverse oscillation mode by forming an insulation layer (current blocking layer) having a stripe-shaped window as a current path, over the active layer, instead of the ridge waveguide structure.

For example, Japanese Unexamined Patent Publication (Kokai) No. 2002-314203 proposes a gallium nitride semiconductor laser having a current blocking layer formed from AlN in a p-type optical guide layer of the active layer. The stripe structure of this laser is made as follows. First, the current blocking layer made of AlN is formed on a device, on which layers up to the p-type optical guide layer have been formed, at a temperature from 400 to 600° C. in a reaction furnace of MOCVD apparatus. After taking out the wafer from the reaction furnace, stripe-shaped window is formed by photolithography process using an alkaline etching solution. Then the wafer is returned into the reaction furnace of the MOCVD apparatus where p-type optical guide layer is grown so as to fill in the window of the current blocking layer, and p-type cladding layer and other layers are formed successively.

SUMMARY OF THE INVENTION

In the gallium nitride semiconductor laser described above, however, the wafer must be taken out of the reaction furnace of the MOCVD apparatus in order to carry out the process of forming the stripe-shaped window in the current blocking layer. Since the wafer taken out of the reaction furnace is exposed to the ambient atmosphere such as air, an oxide layer or the like is formed on the surface of the semiconductor layer through reaction with the atmosphere. Existence of such a layer leads to lower performance of the device, and therefore an operation to remove the layer by etching (hereafter called the etch-back) must be carried out when the wafer is returned to the MOCVD apparatus and semiconductor is grown again. The etch-back operation is usually carried out by blowing hydrogen gas, that is a reducing gas, onto the wafer which is kept at a high temperature in the reaction furnace.

However, since the thickness and constitution of the layer formed on the surface of the semiconductor layer through reaction with the atmosphere vary among wafers and among chips that are formed on a wafer, it is difficult to accurately remove only the layer on a stable basis. When part of the layer remains due to insufficient etch-back on the interface of re-growth, device characteristics will be compromised. Especially when the layer remains in the window of the current blocking layer, the remaining layer makes uneven distribution of the current, thus resulting in uneven light emission. When the etch-back proceeds excessively, on the other hand, not only the layer formed through reaction with the atmosphere but also the semiconductor layer located thereunder (for example, the p-type optical guide layer in the case of Patent Document 1) is etched. If re-growth is carried out under this condition, core of the waveguide becomes too thin in case the underlying semiconductor layer is the optical guide layer, disabling it to confine light satisfactorily. Also because the step in the window becomes too large by over etching, composition of the semiconductor formed by re-growing becomes inhomogeneous due to the step, thus adversely affecting the device characteristics.

With the background described above, it is an object of the present invention to provide a gallium nitride semiconductor laser that has a current blocking layer provided with a stripe-shaped window and has a device structure that ensures stable characteristics, and a method of manufacturing the same.

According to the present invention, there is provided a nitride semiconductor laser comprising a laminate that includes an n-side semiconductor layer, an active layer and a p-side semiconductor layer, said n-side semiconductor layer or p-side semiconductor layer including a current blocking layer that is made of $In_xAl_yGa_{1-x-y}N$ ($0 \leq x \leq 0.1$, $0.5 \leq y \leq 1$, $0.5 \leq x+y \leq 1$) and has a stripe-shaped window formed therein to pass current flow, wherein said current blocking layer is formed on a semiconductor layer having less Al ratio than said current blocking layer, and said semiconductor layer is removed from the portion corresponding to the window of said current blocking layer.

More specifically, according to one aspect of the present invention, there is provided a nitride semiconductor laser device composed of a laminate comprising an n-side semiconductor layer, an active layer and a p-side semiconductor layer, said laminate having a current blocking layer that is made of $In_xAl_yGa_{1-x-y}N$ ($0 \leq x \leq 0.1$, $0.5 \leq y \leq 1$, $0.5 \leq x+y \leq 1$) and has a stripe-shaped window formed therein, and a semiconductor layer is formed on the current blocking layer and the window, wherein the current blocking layer is formed on (a) a first semiconductor layer containing Al and (b) a second semiconductor layer that is formed on the first semiconductor layer and does not contain Al or has a lower mixed crystal ratio of Al than that of the current blocking layer, while the second semiconductor layer is partially removed in a portion corresponding to the window of the current blocking layer.

Also according to the first aspect of the present invention, there is provided a method of manufacturing a nitride semiconductor laser device composed of a laminate comprising an n-side semiconductor layer, an active layer and a p-side semiconductor layer, said laminate having a current blocking layer that is made of $In_xAl_yGa_{1-x-y}N$ ($0 \leq x \leq 0.1$, $0.5 \leq y \leq 1$, $0.5 \leq x+y \leq 1$) and has a stripe-shaped window formed therein, and a semiconductor layer is formed on the current blocking layer and the window, the method comprising the steps of:

(a) forming a first semiconductor layer made of $In_{x1}Al_{y1}Ga_{1-x1-y1}N$ ($0 \leq x_1 \leq 0.1$, $0.1 \leq y_1 \leq 1$, $0.1 \leq x_1+y_1 \leq 1$) on p side or n side of the active layer;

(b) forming a second semiconductor layer made of $In_{x2}Al_{y2}Ga_{1-x2-y2}N$ ($0 \leq x_2 \leq 1$, $0 \leq y_2 = 0.1$, $0 \leq x_2+y_2 \leq 1$) where a mixed crystal ratio of Al, $y_2$, satisfies the expression $y_2 < y_1$ and $y_2 < y_3$ on the first semiconductor layer;

(c) forming a current blocking layer made of $In_{x3}Al_{y3}Ga_{1-x3-y3}N$ ($0 \leq x_3 \leq 0.1$, $0.5 \leq y_3 \leq 1$, $0.5 \leq x_3+y_3 \leq 1$) on the second semiconductor layer;

(d) forming a stripe-shaped window by removing a part of the current blocking layer to such a depth that reaches the second semiconductor layer; and (e) removing the second semiconductor layer that is exposed through the current blocking layer to such a depth that reaches the first semiconductor layer.

According to the first aspect of this invention, stable laser characteristics can be obtained as the layer formed through reaction with the atmosphere is prevented from remaining in the window of the current blocking layer and defective shape can be prevented from being formed due to excessive etch-back, by forming the first and second semiconductor layers below the current blocking layer.

Specifically, since the second semiconductor layer is made of a nitride semiconductor that does not contain Al or has a lower mixed crystal ratio of Al than that of the current blocking layer, it serves as an etching stopper layer when forming the window in the current blocking layer and also protects the device layer located thereunder from ambient gas such as oxygen, before eventually being removed by etch-back process carried out in a vapor phase growth apparatus.

It is preferable that the second semiconductor layer has a mixed crystal ratio of Al lower than that of the first semiconductor layer. This causes the second semiconductor layer to be etched back at a faster rate than the first semiconductor layer that makes contact with the bottom thereof during the etch-back carried out in the vapor phase growth apparatus. As a result, stable laser characteristics can be obtained as the layer formed through reaction with the atmosphere is prevented from remaining in the window of the current blocking layer and defective shape can be prevented from being formed due to excessive etch-back. At this time, the first semiconductor layer serves as an etching stopper layer during the etch-back process and also protects the device layer located thereunder from gas etching.

According to a second aspect of the present invention, there is provided a nitride semiconductor laser device composed of a laminate comprising an n-side semiconductor layer, an active layer and a p-side semiconductor layer, said laminate having a current blocking layer that is made of $In_xAl_yGa_{1-x-y}N$ ($0 \leq x \leq 0.1$, $0.5 \leq y \leq 1$, $0.5 \leq x+y \leq 1$) and has a stripe-shaped window formed therein, and a semiconductor layer is formed on the current blocking layer and the window, wherein the current blocking layer is formed on a growth base layer that is made of semiconductor having a lower mixed crystal ratio of Al than that of the current blocking layer, the growth base layer preferably being such that decomposes at a lower temperature than the current blocking layer does and is partially removed in a portion thereof corresponding to the window of the current blocking layer.

Also according to the second aspect of the present invention, there is provided a method of manufacturing a nitride semiconductor laser device composed of a laminate comprising an n-side semiconductor layer, an active layer and a p-side semiconductor layer, said laminate having a current blocking layer that is made of $In_xAl_yGa_{1-x-y}N$ ($0 \leq x \leq 0.1$, $0.5 \leq y \leq 1$, $0.5 \leq x+y \leq 1$) and has a stripe-shaped window formed therein, and a semiconductor layer is formed on the current blocking layer and the window, the method comprising the steps of:

(a) forming a growth base layer made of $In_{x'}Al_{y'}Ga_{1-x'-y'}N$ ($0 \leq x' \leq 1$, $0 \leq y' \leq 0.1$, $0 \leq x'+y' \leq 1$) on p side or n side of the active layer;

(b) forming a current blocking layer made of $In_xAl_yGa_{1-x-y}N$ ($0 \leq x \leq 0.1$, $0.5 \leq y \leq 1$, $0.5 \leq x+y \leq 1$) on the growth base layer;

(c) forming a stripe-shaped window by removing a part of the current blocking layer to such a depth that reaches the growth base layer;

(d) removing the growth base layer that is exposed through the current blocking layer to such a depth as the layer that makes contact with the bottom of the growth base layer is exposed.

According to the second aspect of this invention, stable laser characteristics can be obtained as the layer formed through reaction with the atmosphere is prevented from remaining in the window of the current blocking layer and defective shape can be prevented from being formed due to excessive etch-back, by forming only the growth base layer of lower Al ratio below the current blocking layer and making the crystallinity of the growth base layer lower than that of the layer that makes contact with the bottom of the growth base layer.

Specifically, since the growth base layer is made of a nitride semiconductor that has lower Al ratio than that of the current blocking layer, it serves as an etching stopper layer when forming the window in the current blocking layer and also protects the device layer located thereunder from ambient gas such as oxygen, before eventually being removed by etch-back process carried out in the vapor phase growth apparatus. Also because the growth base layer is formed with lower crystallinity than that of the layer that makes contact with the bottom thereof, it is removed at a faster rate than the layer located thereunder in the etch-back. As a result, stable laser characteristics can be obtained as the layer formed through reaction with the atmosphere is prevented from remaining and excessive etch-back is prevented.

According to a third aspect of the present invention, there is provided a nitride semiconductor laser device composed of a laminate comprising an n-side semiconductor layer, an active layer and a p-side semiconductor layer, said laminate having a current blocking layer that is preferably made of $In_xAl_yGa_{1-x-y}N$ ($0 \leq x \leq 0.1$, $0.5 \leq y \leq 1$, $0.5 \leq x+y \leq 1$) and has a stripe-shaped window formed therein, wherein there is a residual film portion where part of the current blocking layer that makes contact with the base layer remains in the stripe-shaped window, so that current can be injected into the active layer through the residual film portion.

Also according to the third aspect of the present invention, there is provided a method of manufacturing a nitride semiconductor laser device, the method comprising the steps of:

(a) forming a current blocking layer made of $In_xAl_yGa_{1-x-y}N$ ($0 \leq x \leq 0.1$, $0.5 \leq y \leq 1$, $0.5 \leq x+y \leq 1$) on p side or n side of the active layer;

(b) forming a stripe-shaped window by removing a part of the current blocking layer so that part of the current blocking layer that makes contact with the base layer remains; and (c) etching the surface of the current blocking layer.

The present inventors found that the current blocking layer made of a nitride semiconductor that contains Al in a high concentration such as AlN has a high insulating property but there is a portion where current can flow easily in the vicinity the base layer whereon the current blocking layer grows. This is supposedly because the current blocking layer inherits a crystallinity from the base layer thereunder, resulting in high crystallinity in the portion of the current blocking layer near the base layer. The base layer that makes contact with the bottom of the current blocking layer has crystallinity becoming higher gradually from the interface with the substrate upward due to continuous growth. When the current blocking layer made of an insulating material such as AlN is grown thereon, the portion formed in the early stage of growing has high crystallinity so as to allow current to flow relatively easily therein. Also in the portion of the current blocking layer formed in the early stage of growing, a trace of impurities can easily mix which also makes a cause of allowing current to flow. When the current blocking layer is caused to continue growing, on the other hand, resistivity increases so as to become more insulating as the growth proceeds, since the nitride semiconductor having a high mixed crystal ratio of Al has a tendency to have lower crystallinity as it grows. The third invention makes use of such a property, and eliminates the possibility of blocking satisfactory current injection into the active layer by leaving a proper thickness of the current blocking layer in the portion thereof formed in the early stage of growing.

The residual film portion of the current blocking layer that is left to remain in the window has high Al ratio and good crystallinity, and is therefore decomposed at a slower rate in reducing atmosphere such as hydrogen gas. Therefore, such a portion left in the window can serve as an etching stopper layer when removing the layer formed through reaction with the atmosphere from the wafer surface by etch-back. Although the remaining portion of the current blocking layer in the window is also decomposed a little, sufficient function of the etching stopper layer can be achieved if the thickness of the remaining portion of the current blocking layer is properly set such that the layer somewhat remains after decomposition. If the remaining portion of the current blocking layer functions as the etching stopper layer, stable laser characteristics can be obtained by preventing the layer formed through reaction with the atmosphere from remaining on the wafer surface and excessive etch-back from occurring.

The part of the current blocking layer left to remain also has an effect of mitigating the step in the window. Since the present invention utilizes the portion of the current blocking layer, that has good crystallinity and has been observed in the current blocking layer of the prior art, as the etching stopper layer, total thickness of the current blocking layer may be comparable to that of the prior art. As a consequence, the part of the current blocking layer left to remain in the window decreases the height of the step in the window, makes the composition of the layer formed thereon more uniform, and mitigates other problems originating from the step.

Thickness of the portion of the layer remaining after etch-back is preferably 10 Å or more in order to function as the etching stopper layer and decrease the step in the window. Thickness of the residual film portion of the current blocking layer is also preferably less than 100 Å, since current injection into the active layer is hampered when it is too thick.

Thus according to the third invention, stable laser characteristics can be obtained by leaving a portion of the current blocking layer to remain, made of nitride semiconductor of high Al content, that is located near the base layer. The remaining portion has good crystallinity so as to prevent the layer formed through reaction with the atmosphere from remaining on the wafer surface and excessive etch-back from occurring.

DESCRIPTION OF THE PREFERRED EMBODIMENTS

Figure 1:
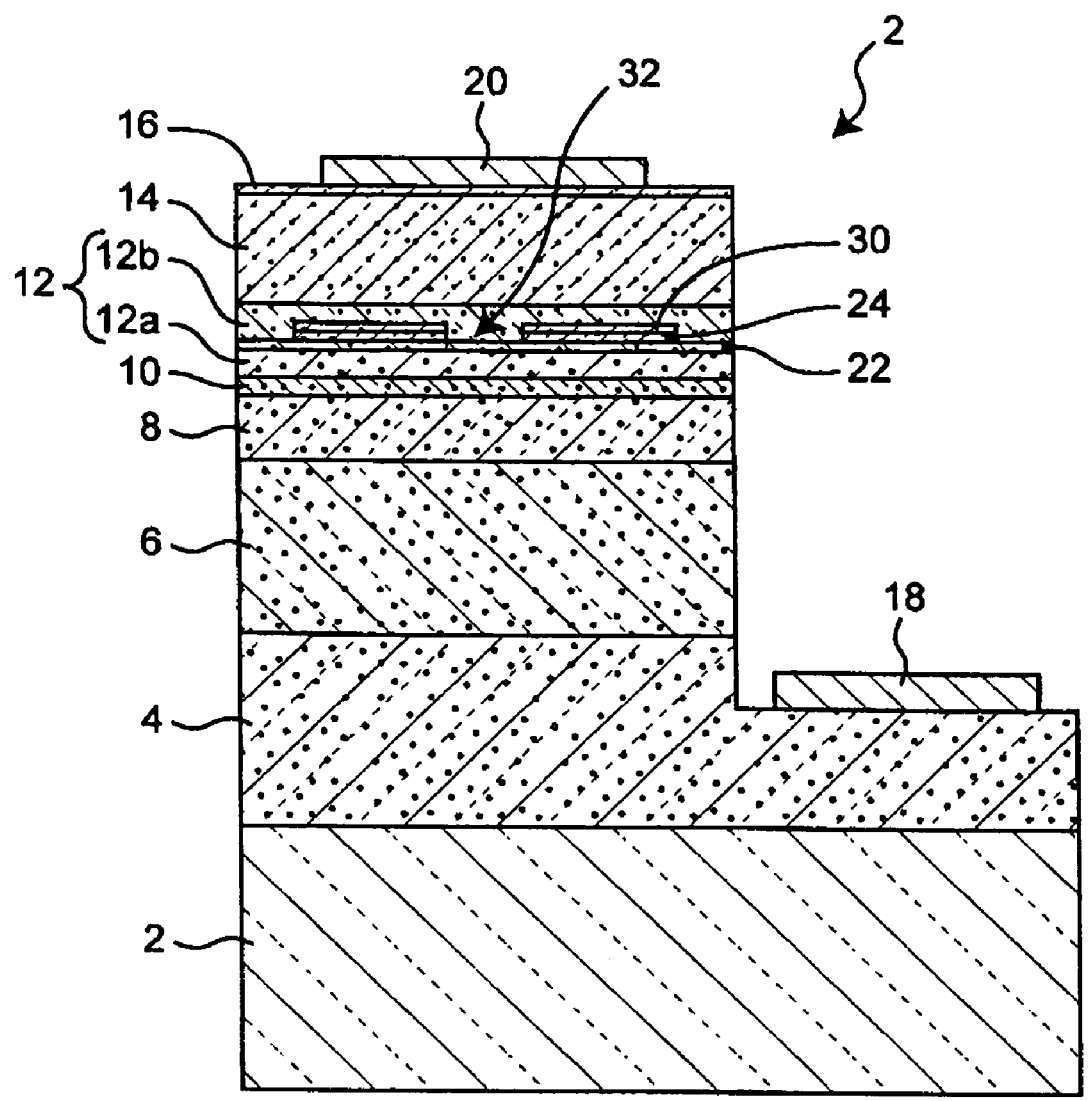
FIG. 1 is a sectional view showing a gallium nitride semiconductor laser device according to first embodiment of the invention.

Now preferred embodiments of the gallium nitride semiconductor laser according to the present invention will be described with reference to the accompanying drawings. In the drawings, identical numerals denote the same or corresponding members.

In this specification, bottom or lower side of the gallium nitride semiconductor laser refers to the side of the semiconductor layer that constitutes the laser where it started to grow, and top or upper side refers to the side of the semiconductor layer where it stopped growing. Since the growing direction of the semiconductor layer substantially agrees with the direction in which dislocation proceeds, starting point of dislocation corresponds to the bottom or lower side and ending point of dislocation corresponds to the top or upper side in the laser device.

In this specification, the notion that the gallium nitride semiconductor has good crystallinity means that density of etch pits is relatively low when measured in wet etching, or that the layer is relatively difficult to remove by wet etching.

Embodiment 1

FIG. 1 is a sectional view showing a gallium nitride semiconductor laser device according to this embodiment. An n-side contact layer 4 made of GaN, an n-side cladding layer 6 made of AlGaN, an n-side optical guide layer 8 made of GaN, a multiple quantum well active layer 10 having a well layer containing In, a p-side optical guide layer 12 made of GaN, a p-side cladding layer 14 made of AlGaN and a p-side contact layer 16 made of GaN are formed on a substrate 2 made of a different material such as sapphire. Formed in the p-side optical guide layer 12 is a current blocking layer 30 that has a stripe-shaped window 32. The current blocking layer 30 is made of a gallium nitride semiconductor that contains Al in ratio of 0.5 or higher and has high resistivity, so as to concentrate the current within the active layer 10 located in the window 32 and control horizontal transverse mode of laser oscillation.

Figure 2A:
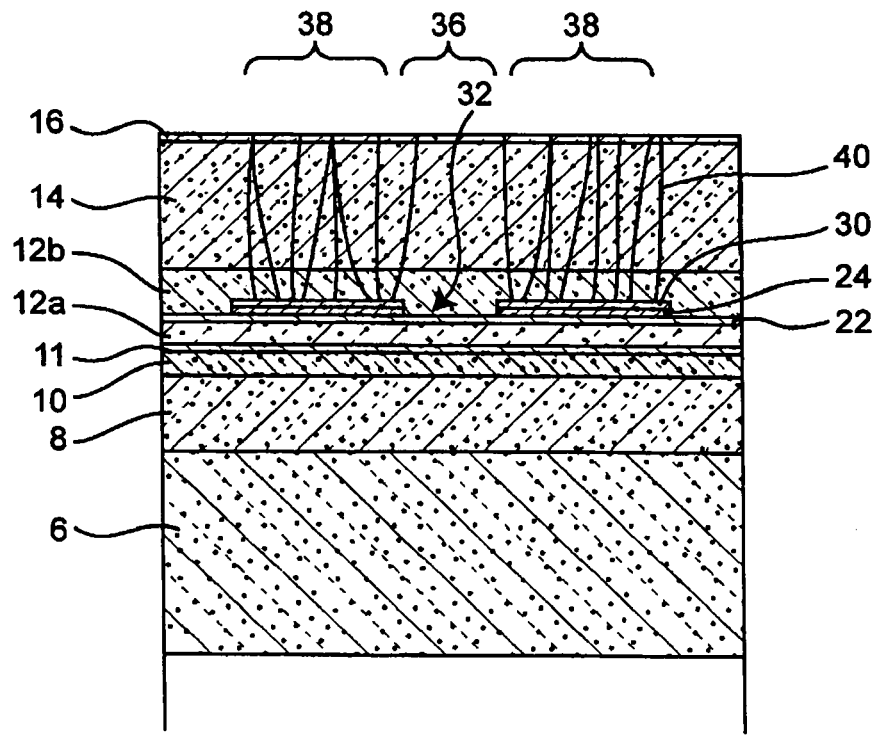
FIGS. 2A and 2B are partially enlarged sectional views showing the gallium nitride semiconductor laser device according to the first embodiment of the invention.

FIGS. 2A and 2B are partially enlarged sectional views showing the structure in the vicinity of the current blocking layer 30 in more detail. As shown in FIG. 2A, a carrier confinement layer 11 made of gallium nitride semiconductor containing Al is formed with a thickness from 50 to 150 Å on the active layer 10 made of gallium nitride semiconductor containing In, and the p-side optical guide layer 12 made of GaN is formed thereon. The p-side optical guide layer 12 comprises a first p-side optical guide layer 12a located below the current blocking layer 30 and a second p-side optical guide layer 12b. The current blocking layer is formed above the first p-side optical guide layer 12a via a first semiconductor layer 22 and a second semiconductor layer 24, and the window 32 is formed to penetrate the current blocking layer 30 and the second semiconductor layer 24. The second p-side optical guide layer 12b is formed so as to fill in the window 32.

The current blocking layer 30 is not only high in resistance but also low in crystallinity because of the high Al ratio of 0.5 or higher. As a result, as shown schematically in FIG. 2A, dislocations 40 occur with a high density also in the p-side cladding layer 14 and the p-side contact layer 16 formed above the current blocking layer 30, thus making it difficult for current to flow therein. That is, the current blocking layer 30 exercises current block effect in the semiconductor layer located above it by decreasing the crystallinity thereof, in addition to the current block effect achieved by the resistance of itself. Therefore, even when the current blocking layer 30 is formed with a relatively small thickness of 100 to 500 Å, it can perform sufficient current blocking effect through the combined effect of high resistance and low crystallinity of itself.

The second semiconductor layer 24 located below the current blocking layer 30 is made of a nitride semiconductor having a mixed crystal ratio of Al lower than that of the current blocking layer 30, so as to function as an etching stopper layer when the window 32 is formed in the current blocking layer 30 by photolithography, and also protect the device layer from ambient gas such as oxygen, before eventually being removed from the current path by etch-back carried in a vapor phase growth apparatus.

This is because the second semiconductor layer 24 has The Al ratio (preferably 0.1 or less) lower than that of the current blocking layer 30, it is etched with an alkaline solution at a rate different from that of the current blocking layer 30 that has the Al ratio of 0.5 or higher, and therefore remains without being etched when the current blocking layer 30 is etched with an alkaline solution. Thus when the window 32 is formed in the current blocking layer 30, the second semiconductor layer 24 serves as the etching stopper layer and prevents excessive etching. Also because the second semiconductor layer 24 is made of a nitride semiconductor having low Al ratio, it reacts at a low rate with oxygen and other elements contained in air. Therefore, the second semiconductor layer 24 can effectively protect the first semiconductor layer located thereunder from the ambient gas such as oxygen in the photolithography process carried out outside the vapor phase growth apparatus.

In the meantime, the second semiconductor layer 24 is damaged on the surface thereof through the etching process to remove the current blocking layer 30 and exposure to the atmosphere. However, because the second semiconductor layer of this embodiment is made of a nitride semiconductor having lower Al ratio that that of the first semiconductor 22, it easily decomposes when exposed to a reducing gas such as hydrogen at a high temperature. As a result, the second semiconductor layer 24 that has been damaged can be easily removed from the window 32 that becomes the current path, by the etch-back process carried out in the vapor phase growth apparatus.

The first semiconductor layer 22, on the other hand, serves as an etching stopper layer during the etch-back process carried out before re-growth on the current blocking layer 30 in the vapor phase growth apparatus and also protects the first p-side optical guide layer 12a located thereunder from gas etching. The first semiconductor layer 22 is made of gallium nitride semiconductor having higher Al ratio than the second semiconductor layer and is not easily decomposed when exposed to reducing gas such as hydrogen at a high temperature. Therefore, even when the etch-back process is carried out in the vapor phase growth apparatus for a long period of time so as to completely remove the damaged second semiconductor layer 24, the etch-back process stops at the first semiconductor layer 22 and the first p-side optical guide layer 12a is protected from excessive etching.

While the first semiconductor layer 22 remains in the current path that leads to the active layer 10, it has better crystallinity and lower resistance than the current blocking layer 30 because it has Al ratio comparable to or lower than that of the current blocking layer and is preferably grown at a higher temperature than that of growing the current blocking layer. Also because it suffices that the first semiconductor layer 22 has the minimum thickness required to function as the etching stopper layer during etch-back, it may be formed in such a thin film that does not block the current injection into the active layer 10, and substantially no increase occurs in the threshold current of laser.

As described above, with the gallium nitride semiconductor laser according to this embodiment, due to the complementary actions of the first semiconductor layer and the second semiconductor layer, the layer formed through reaction with the atmosphere is prevented from remaining in the window of the current blocking layer 30 and defective shape can be prevented from being formed due to excessive etch-back, thus achieving stable laser characteristics.

Also because excessive etching is prevented by the first and second semiconductor layers, flatness of the layer formed on the current blocking layer 30 and the device characteristics are improved as shown in FIG. 2A. Low crystallinity of the current blocking layer 30 also contributes to the improvement in flatness. That is, crystal grows at a faster rate in a region 36 located above the window 32 than in a region 38 located above the current blocking layer 30, since the current blocking layer 30 has lower crystallinity. As a result, as shown in FIG. 2A, the window 32 which is a recess can be easily filled so as to form a flat surface with the second p-side optical guide layer 12b. As the second p-side optical guide layer 12b is formed flat, compositions of the p-side cladding layer 14 and the p-side contact layer 16 formed thereon can be restricted from becoming inhomogeneous, so that the functions of the layers are improved. In case the p-side cladding layer 14 has super lattice structure, in particular, it is important that the second p-side optical guide layer 12b fills the window 32 to make a flat surface. Because the super lattice structure is disturbed when there is a step on the surface of the p-side optical guide layer 12 that makes contact with the bottom thereof.

In addition, as shown in FIG. 2B, the region 36 located above the window 32 may be formed thicker than the region 38 located above the current blocking layer 30. That is, since the current blocking layer 30 has low crystallinity, the region 36 located above the window 32 grows faster than the region 38 located above the current blocking layer 30 and therefore the larger the difference in the rate of growth, the thicker becomes the region 36 located above the window 32. It is advantageous for confining light within the waveguide to make the region 36 located above the window 32 thicker. Thickness distribution can be controlled as shown in FIG. 2A or 2B by regulating the crystallinity of the current blocking layer 30. Crystallinity of the current blocking layer 30 can be controlled by regulating the Al ratio or the growing temperature of the current blocking layer 30. The higher the Al ratio of the current blocking layer 30 and the lower the growing temperature, the lower becomes the crystallinity of the current blocking layer 30.

Figure 2:
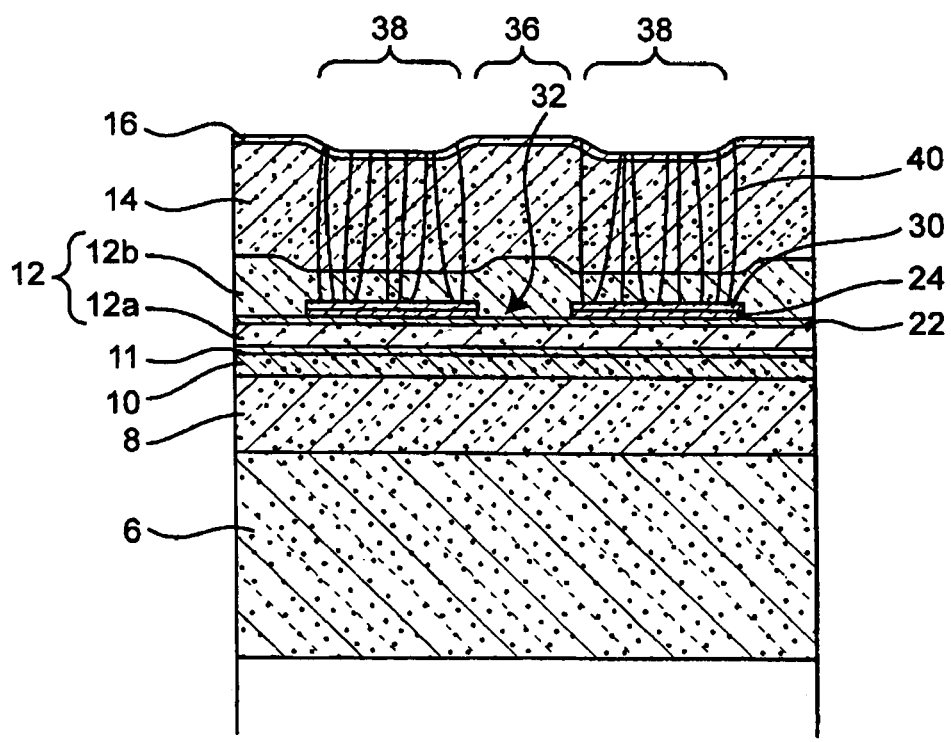
Figure 3:
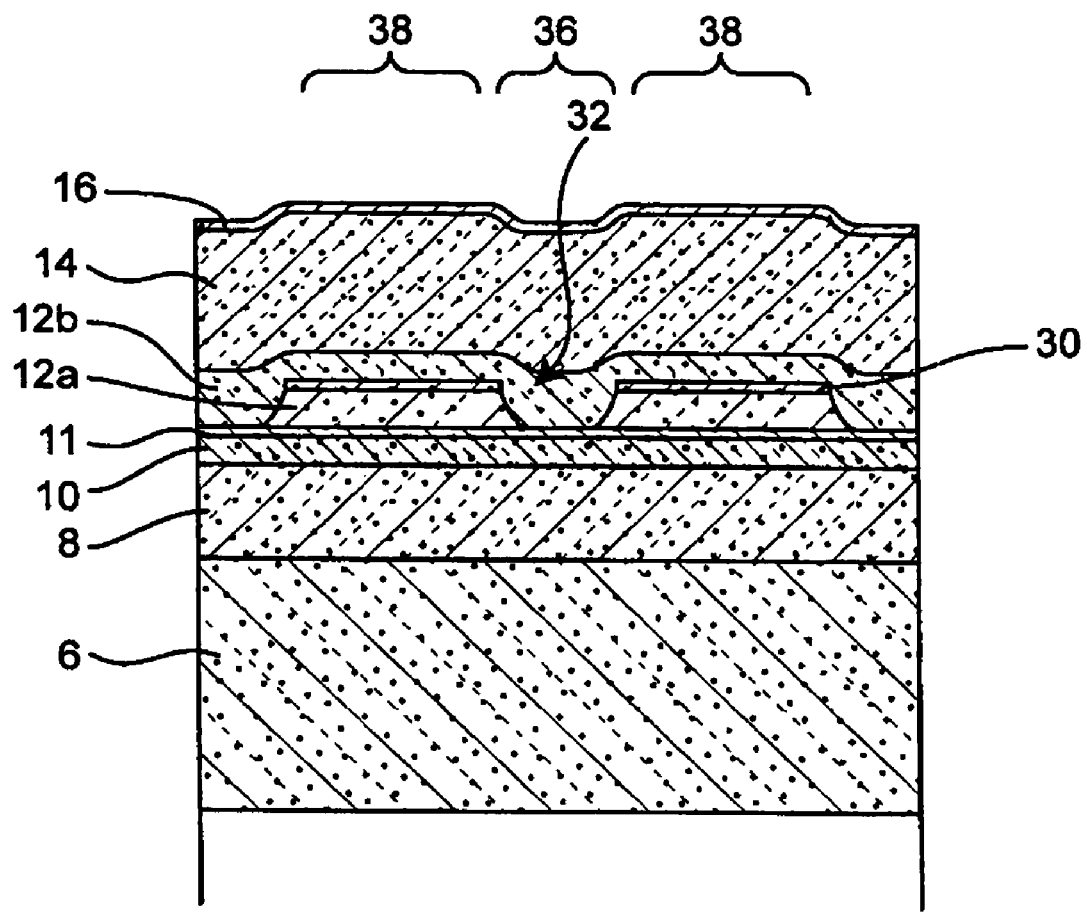
FIG. 3 is a sectional view showing a gallium nitride semiconductor laser device of the prior art.

In case the structure shown in FIG. 2 does not include the first and second semiconductor layers, on the other hand, such troubles become more likely to occur as the layer formed through reaction with the atmosphere remains on the first p-side optical guide layer 12a and etch-back proceeds excessively. FIG. 3 is a sectional view showing the structure of the first p-side optical guide layer 12a that has been etched back excessively. In this embodiment, the first p-side optical guide layer 12a is made of GaN and is therefore easily decomposed when exposed to reducing gas such as hydrogen at a high temperature. As a consequence, once the etch-back proceeds excessively, the etch-back can easily proceed up to the carrier confinement layer 11 that is made of nitride semiconductor containing Al, as shown in FIG. 3. Since the total thickness of the p-side optical guide layer 12 is usually from 1500 to 2000 Å, excessive etch-back of 750 to 1000 Å can occur. As a result, in contrary to the case shown in FIG. 2B, core of the waveguide in the region 36 that makes the current path becomes thinner compared to the surrounding region 38, and the efficiency of light confinement decreases. Also because a large step is made at the end of the current blocking layer 30, inhomogeneous composition tends to occur such as precipitation of Al into the step. In case the p-type cladding layer 14 has super lattice structure, normal super lattice structure may not be maintained due to the influence of the step.

Now preferable thickness and composition of each layer will be described in detail.

[First Semiconductor Layer]

The first semiconductor layer 22 is made of gallium nitride semiconductor having The Al ratio that is comparable to or lower than that of the current blocking layer 30 and is higher than that of the second semiconductor layer 24. As such, when compositions of the first semiconductor layer, the second first semiconductor layer and the current blocking layer are represented as $In_{x1}Al_{y1}Ga_{1-x1-y1}N$, $In_{x2}Al_{y2}Ga_{1-x2-y2}N$ and $In_{x3}Al_{y3}Ga_{1-x3-y3}N$, it is preferable that the ratios are such that relation $y_2 < y_1 \leq y_3$ is satisfied. Durability of the first semiconductor layer 22 against the reducing gas becomes higher as the Al ratio becomes higher. Therefore, the Al ratio $y_1$ of the first semiconductor layer is preferably 0.1 or higher, and more preferably 0.2 or higher. When the Al ratio $y_1$ is too high, on the other hand, resistance of the first semiconductor layer tends to become higher. Since the first semiconductor layer 22 becomes a part of the current path to the active layer, higher resistance of the first semiconductor layer 22 increases the threshold current of laser oscillation and is not desirable. Thus the Al ratio $y_1$ of the first semiconductor layer is preferably 0.8 or lower, more preferably 0.5 or lower.

The ratio of In contained in the first semiconductor layer 22 is preferably low. This is because the first semiconductor layer absorbs light emitted from the active layer when it contains In, since the first semiconductor layer 22 is located in the waveguide. Thus the first semiconductor layer has an In ratio x1 of 0.1 or lower, and preferably 0.05 or lower, and more preferably the first semiconductor layer essentially does not contain In. From the discussion described above, preferable composition of the first semiconductor layer is $Al_aGa_{1-a}N$ $(0.1 \leq a \leq -1)$ The first semiconductor layer cannot perform the etching stopper function sufficiently during etch-back when it is too thin, and has higher resistance when it is too thick. Therefore, the thickness of the first semiconductor layer is preferably from 20 to 300 Å, and more preferably from 50 to 200 Å. In case the first semiconductor layer is made of AlN, it can function as the etching stopper layer when the thickness is about 10 Å or more.

The layer that makes contact with the bottom of the first semiconductor layer is preferably an optical guide layer. It becomes easier to control the confinement of light when the current blocking structure is formed so as to make contact with the optical guide layer.

Function of the first semiconductor layer may also be carried out by a cap layer to be described later. When the cap layer is caused to perform the etching stopper function, layers having high Al ratio can be decreased and therefore the operating voltage can be decreased.

The second semiconductor layer 24 preferably is made of a gallium nitride semiconductor having lower Al ratio than those of the current blocking layer 30 and the first semiconductor layer 22, namely a gallium nitride semiconductor having a composition represented by the general formula $In_{x2}Al_{y2}Ga_{1-x2-y2}N$ $(0 \leq x_2 \leq 1, 0 \leq y_2 \leq y_1, 0 \leq x_2+y_2 \leq 1)$. The lower the Al ratio in the second semiconductor layer, the greater the difference in the etching rate between the second semiconductor layer and the current blocking layer 30, thus making it easier to remove by etch-back. The second semiconductor layer 24 has the Al ratio $y_2$ of 0.1 or lower, and preferably 0.05 or lower, and more preferably essentially does not contain Al.

The second semiconductor layer preferably contains In. When InN having lower decomposition temperature is contained in the mixed crystal, the layer becomes easier to decompose at a high temperature and can be removed by etch-back more easily. In contained in the second semiconductor layer also has an effect of absorbing stray light that has leaked from the active layer. In other words, light emitted by the active layer that is made of a nitride semiconductor containing In is likely to be absorbed by another nitride semiconductor containing In. Therefore, by making such a constitution as the second semiconductor layer that sandwiches the active region on both sides contain In, stray light that has leaked from the active region can be absorbed and quality of the beam can be improved. With this regard, In ratio $x_2$ of the second semiconductor layer is preferably in a range from 0 to 0.2, and more preferably from 0.05 to 0.15. From the discussion described above, preferable composition of the second semiconductor layer is $In_bGa_{1-b}N$ ($0.05 \leq b \leq 0.15$).

The second semiconductor layer is preferably grown with low crystallinity in order to make it easy to remove by etch-back. Preferably, the second semiconductor layer is formed in polycrystalline or amorphous structure. Since the second semiconductor layer of such a structure has a high resistance, combined effect thereof and the current blocking layer formed thereon makes it possible to achieve better current blocking effect. Also because the second semiconductor layer performs part of the current blocking effect, the current blocking layer may be formed with a smaller thickness. Crystallinity of the second semiconductor layer 24 can be made lower by increasing the In ratio $x_2$ of the second semiconductor layer or decreasing the growing temperature. When the growing temperature of the second semiconductor layer 24 is decreased, it is preferable to set the growing temperature lower than 1000° C., more preferably to 600° C. or lower.

When crystallinity of the second semiconductor layer becomes lower, it has an effect of making it easier to remove the current blocking layer 30 that is grown thereon. That is, if the layer that contacts the bottom of the current blocking layer 30 has good crystallinity, crystallinity of the current blocking layer 30 becomes partially higher in the vicinity of the layer boundary, thus making it difficult to remove the portion by etching. By making crystallinity of the second semiconductor layer 24 that makes contact with the bottom of the current blocking layer 30 lower, it is made possible to grow the current blocking layer 30 with low crystallinity from the start of growth, thereby making it easier to remove the current blocking layer 30 in the window 32. Especially when the second semiconductor layer 24 contains impurity in a concentration of $5 \times 10^{17}/cm^3$ or higher, more preferably $5 \times 10^{18}/cm^3$ or higher, crystallinity of the second semiconductor layer 24 becomes lower, thereby making it easier to remove the current blocking layer 30. Also as the second semiconductor layer 24 contains impurities in high concentration, it becomes easier to absorb stray light coming from the active layer, so that oscillation of higher mode can be suppressed and laser beam of stable single mode can be obtained.

The second semiconductor layer 24, if too thin, cannot protect the first semiconductor layer 22 sufficiently and, if too thick, makes the influence of the step dominant. As the step formed by the current blocking layer and the second semiconductor layer becomes larger, it becomes difficult to form the cladding layer and the contact layer located above the step in super lattice (SL) structure, resulting in lower carrier mobility and higher operating voltage. Also because it makes Al, Mg and other elements more likely to precipitate in the step, band gap increases which also contributes to the higher operating voltage. Since higher operating voltage leads to larger electric power supplied, it results in larger heat generation and higher threshold. Based on these considerations, the thickness of the second semiconductor layer is preferably from 10 to 300 Å, and more preferably from 50 to 200 Å.

[Current Blocking Layer 30]

The current blocking layer 30 is made of a nitride semiconductor having a composition represented by the general formula $In_{x3}Al_{y3}Ga_{1-x3-y3}N$ ($0 \leq x_3 \leq 0.1$, $0.5 \leq y_3 \leq 1$, $0.5 \leq x_3+y_3 \leq 1$). Forming the current blocking layer 30 from the gallium nitride semiconductor represented by the above general formula, instead of an insulating material such as $SiO_2$, makes it possible to grow the current blocking layer 30 in the same vapor phase growth apparatus as that for the other device structure. Forming the current blocking layer 30 from the gallium nitride semiconductor instead of a different material such as $SiO_2$ also has an effect of improving the linearity of the laser beam. If $SiO_2$ is embedded in an optical guide layer or the like made of GaN, for example, significant difference between the refractive index of $SiO_2$, about 1.5, and the refractive index of GaN, that is 2.5, causes a deviation of the laser output from linearity and the beam to fluctuate. Although the beam may be stabilized by making the current path narrower, it results in higher current density and shorter service life. If AlN is used for the current blocking layer, in contrast, there is a smaller difference in refractive index which is 2.1 for AlN and 2.5 for GaN, thus the linearity is improved and the beam is stabilized.

The higher the Al ratio $y_3$ in the current blocking layer 30, the higher becomes the insulating property of the current blocking layer 30, and the lower becomes the crystallinity of the layer formed thereon, and therefore the better becomes the current blocking effect. Thus the Al ratio $y_3$ in the current blocking layer 30 is at least 0.5 or higher, preferably 0.75 or higher, and more preferably 0.9 or higher. Most preferably, the current blocking layer 30 is made of AlN. When the current blocking layer 30 is made of AlN, such effects are obtained that wet etching becomes easier, current blocking effect becomes remarkable due to higher insulating property, light is effectively confined due to lower refractive index and heat dissipation characteristic from the device improves due to higher heat conductivity.

The current blocking layer 30 may contain a small amount of In. Making the current blocking layer 30 containing a small amount of In makes it easier to absorb light emitted by the active layer 10. Putting the current blocking layer 30 having such a constitution on the active region makes it possible to absorb stray light leaking from the active region and improve the beam property. In order to absorb the stray light, In the ratio $x_3$ is set to 0.01 or higher, preferably 0.05 or higher, and more preferably 0.1 or higher. However, it is preferable to control the In ratio to 0.5 or lower, preferably 0.3 or lower, more preferably 0.2 or lower and most preferably 0.15 or lower.

The current blocking layer 30 is preferably grown at a low temperature, 600° C. or lower, for example, so that it is grown with low crystallinity. Growing the current blocking layer 30 at a low temperature makes it easier to process it by etching with an alkaline solution or the like and improves the current blocking effect. When the current blocking layer 30 is too thin, it cannot perform the current blocking function sufficiently, while the light confinement effect becomes weaker and the threshold increases. When the current blocking layer 30 is too thick, on the other hand, the influence of the step becomes greater, it becomes difficult to form a flat surface when re-growing and it also becomes difficult to form the cladding layer in super lattice (SL) structure. Thus the thickness of the current blocking layer 30 is preferably from 100 to 500 Å, and more preferably from 150 to 300 Å.

Figure 5:
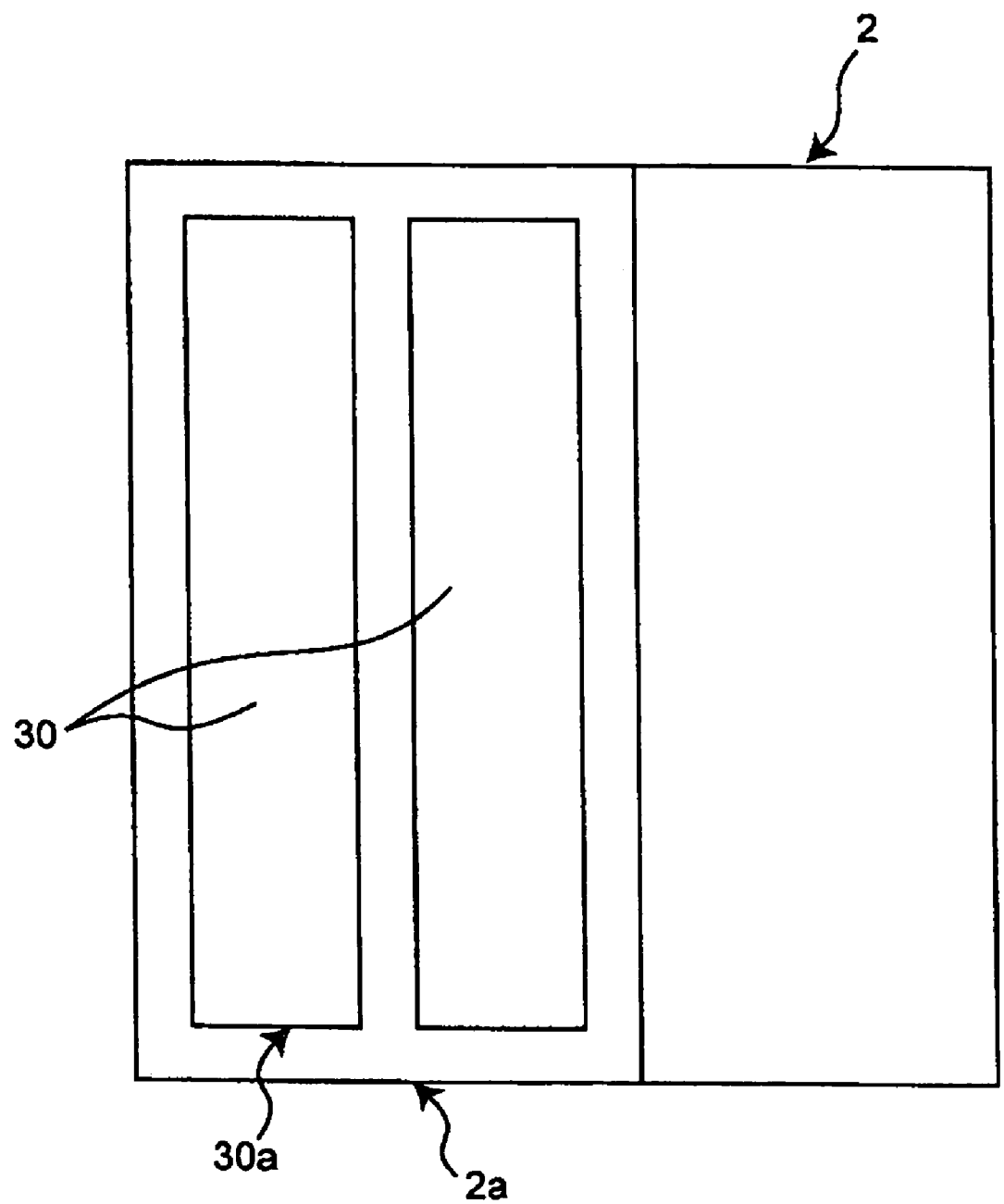
FIG. 5 is a plan view showing an area where current blocking layer is to be formed in the gallium nitride semiconductor laser according to the first embodiment of the invention.

It is also preferable to form the current blocking layer 30 so that the end face thereof in the longitudinal direction 30a is located inward from the end face 2a of the resonator of the laser device 2, as shown in FIG. 5. When the current blocking layer 30 is formed short of the end face 2a of the resonator, energy density at the end face 2a of the resonator becomes lower and COD (catastrophic optical damage) characteristic can be improved. It provides also such a benefit that defective shape and cracks become less likely to occur in the waveguide when forming the end face of resonator by RIE or cleavage. In case the resonator surface is formed by etching, it becomes easier to form a flat resonator surface when the current blocking layer 30 is formed apart from the end face of the resonator. This is because, since there is the step in the window of the current blocking layer 30, it becomes difficult to form flat etching surface due to the influence of the step when the current blocking layer 30 reaches the end face of the resonator.

Side face of the current blocking layer 30 in the lateral direction is also preferably formed inward of the side face of the laminate that constitutes the stripe structure of the laser device 2 as shown in FIG. 5. The current blocking layer having high a mixed crystal ratio of Al is difficult to etch uniformly, and is likely to have rough surface formed by etching. As a result, in case the current blocking layer has been formed with the same surface area as the other nitride semiconductor layers, etching the laminate of the nitride semiconductor layers to form an n electrode may cause rough etching surface and higher connection resistance of the n electrode. If the current blocking layer 30 is formed within a region inward from the side face of the stripe structure, it becomes easier to carry out etching to form the n electrode and the resistance thereof can be decreased.

In the meantime, the current blocking layer has a high a mixed crystal ratio of Al and therefore has lattice constant and thermal expansion coefficient that are significantly different from those of the layers located above and below thereof. When the current blocking layer 30 is formed within a region located apart from the end face and/or the side face of the laminate that constitutes the stripe structure to such an extent that does not affect the current blocking effect and the light confinement function, namely within the inner region, strain can be reduced and cracks can be suppressed from occurring.

[Re-growth Layer]

If the semiconductor layers that are re-grown while filling the window 32 of the current blocking layer 30 (hereafter called the re-growth layers) are made of a nitride semiconductor which essentially does not contain Al, preferably GaN, it becomes easier to fill in the widow 32 into a flat surface and the problem of uneven distribution of Al in the re-growth layer formed in the window can be solved. Uneven distribution of Al has greater influence on the laser device characteristic than the uneven concentration of impurities such as Mg. The layer re-grown by filling the window 32 is preferably an optical guide layer rather than a cladding layer. By forming the re-growth layer as the optical guide layer, it becomes easier to fill in the window and grow flat, and it is made possible to improve the characteristics of the cladding layer of super lattice structure.

Especially when forming the current blocking layer 30 on the p side of the active layer, there are several preferred conditions for the semiconductor layer that is re-grown while filling the window 32 of the current blocking layer 30. First, the re-growth layer preferably has a refractive index comparable to or lower than that of the layer that makes contact with the bottom of the first semiconductor layer 22. This further improves the effect of confining light in the active layer. It is also preferable to grow the re-growth layer at such a temperature that is comparable to or higher than that of the layer that makes contact with the bottom of the first semiconductor layer 22 and is suitable for maintaining the crystallinity of the active layer. Higher growing temperature improves the crystallinity of the re-growth layer and decreases the resistance. In addition, the re-growth layer preferably contains impurities in a concentration that is comparable to or higher than that of the layer that makes contact with the bottom of the first semiconductor layer 22. Higher impurity concentration in the re-growth layer stabilizes the higher mode of laser oscillation as the stray light is absorbed in portions on both sides of the window. The re-growth layer may also be advantageously turned into p-type so as to decrease the operating voltage, by intentionally adding a p-type impurity such as Mg to the re-growth layer.

[Active Layer 10]

The active layer 10 is preferably made of gallium nitride semiconductor where at least the light emitting region contains In, and more preferably has such a multiple quantum well structure (MQW structure) as $In_{x1}Ga_{1-x1}N$ well layers ($0<X_1<1$) and $In_{x2}Ga_{1-x2}N$ barrier layers ($0 \leq X_2 < 1$, $X_1 > X_2$) are stacked alternately a required number of times. The well layer is preferably formed undoped, while all barrier layers are doped with n-type impurity such as Si or Sn in concentration from $1 \times 10^{17}$ to $1 \times 10^{19}/cm^3$. Doping the barrier layers with the n-type impurity increases the initial electron concentration in the active layer, thereby improving the efficiency of injecting electrons into the well layer, thereby improving the efficiency of the laser to emit light. The active layer 10 may end with a well layer or end with a barrier layer. Since the active layer 10 contains a relatively high content of InN that has a high vapor pressure to form a mixed crystal, it is easy to decompose and can be grown at a lower temperature (not higher than about 900° C.) than the other layers.

[Carrier Confinement Layer 11]

The carrier confinement layer 11 is made of p-type gallium nitride semiconductor having a higher mixed crystal ratio of Al than the p-side cladding layer 14, and preferably has a composition of $Al_cGa_{1-c}N$ ($0.1 \leq c \leq 0.5$). Thickness of the carrier confinement layer 11 is preferably from 50 to 200 Å. The carrier confinement layer 11 is doped with p-type impurity such as Mg in a high concentration, preferably from $5 \times 10^{17}$ to $1 \times 10^{19}/cm^3$. With such a constitution, the carrier confinement layer 11 can effectively confine electrons within the active layer and decreases the threshold of the laser. The carrier confinement layer 11 also has the function to protect the active layer 10 that contains In and therefore easily decomposes. That is, since the carrier confinement layer 11 is made of AlGaN that has high decomposition temperature, it can effectively protect the active layer 10 from decomposition. The carrier confinement layer 11 is preferably grown at a low temperature not higher than 900° C. in an inert gas such as nitrogen so that the active layer 10 will not be decomposed.

[N-side Optical Guide Layer 8, P-side Optical Guide Layer 12]

The n-side optical guide layer 8 and the p-side optical guide layer 12 are preferably made of gallium nitride semiconductor that essentially does not contain Al. Preferably, these layers are made of $In_dGa_{1-d}N$ ($0.1 \leq d \leq 1$), and more preferably made of GaN. When embedding the current blocking layer in the p-side optical guide layer, the p-side optical guide layer is divided into two layers of first p-side optical guide layer 12a and second p-side optical guide layer 12b, and the current blocking layer 30 is formed between these layers. By forming the second p-side optical guide layer 12b in such a composition that does not essentially contain Al, it becomes easier to achieve a flat surface when the current blocking layer 30 is embedded. Uneven distribution of Al in the window can also be eliminated. The first p-side optical guide layer 12a and the second p-side optical guide layer 12b may have different compositions and may be formed in different processes. The second p-side optical guide layer 12b, in particular, preferably has lower refractive index and higher impurity concentration and is grown at a higher temperature than the first p-side optical guide layer. The same applies also to a case of embedding the current blocking layer 30 in the n-side optical guide layer.

[N-side Cladding Layer 6, P-side Cladding Layer 14]

The n-side cladding layer 6 and the p-side cladding layer 14 are preferably formed by stacking nitride semiconductor layers, that have different levels of band gap energy of which at least one includes nitride semiconductor layer that contains Al, in super lattice structure. For the nitride semiconductor layer that contains Al, $Al_eGa_{1-e}N$ ($0<e<1$) is preferably used. More preferably, super lattice structure is formed by stacking GaN and AlGaN. Since the mixed crystal ratio of Al of the entire cladding layer can be increased by forming the n-side cladding layer 6 and the p-side cladding layer 14 in super lattice structure, threshold of the laser can be decreased. Moreover, number of pits formed in the cladding layer can be decreased by forming it in super lattice structure. Crystallinity can also be improved by modified doping, wherein one of the layers that constitute the super lattice structure is doped more heavily than another. Doping may also be applied similarly to both layers.

[P-side Ohmic Electrode]

A p-side ohmic electrode 20 is formed on the p-side contact layer 16. As the material to form the p-side electrode 20, Ni, Co, Fe, Cr, Al, Cu, Au, W, Mo, Ta, Ag, Pt, Pd, Rh, Ir, Ru, Os and oxides and nitrides of these elements may be used, in the form of single layer, alloy or multi-layer film. Preferably, at least one kind selected from among Ni, Co, Fe, Cu, Au and Al, or oxide or nitride of these elements may be used. Such a 2-layer structure is preferable that comprises an ohmic electrode provided in contact with the semiconductor layer and a pad electrode provided thereon. When multiple-layer film is employed, desirable combination is Ni/Au/Pt, Ni/Au/Rh oxide, Pd/Pt, Ni/Au, Co/Au or the like. It is also preferable that such a structure as described above is formed as the ohmic electrode that makes contact with the semiconductor layer, and the pad electrode is formed separately thereon. The pad electrode may also be made of a material similar to those described above, and it is preferable to use a metal of platinum group or oxide thereof in the interface with the ohmic electrode which improves thermal stability.

Width of the p-side ohmic electrode 20 is preferably larger than the width of the window 32 and smaller than the width of the current blocking layer 30 (total width including window). By forming the p-side ohmic electrode 20 with such a width, it is made possible to efficiently inject current into the window. Length of the p-side ohmic electrode 20 in the direction substantially parallel to the laser beam guiding direction is preferably shorter than the length of the current blocking layer 30. By forming the p-side ohmic electrode 20 with such a length, it is made possible to more efficiently inject current into the window.

[N-side Electrode 18]

As the material to form the n-side electrode 18, Ni, Co, Fe, Ti, Cu, Au, W, Zr, Mo, Ta, Al, Ag, Pt, Pd, Rh, Ir, Ru, Os or the like may be used, in the form of single layer, alloy or multi-layer film. Preferably, Ti/Al, V/Al, V/Pt/Au, Ti/Mo/Ti/Pt/Au or Ti/W/Ti/Pt/Au may be used. Ti/Mo/Ti/Pt/Au and Ti/W/Ti/Pt/Au are especially preferable in case heavy load is applied to the electrode during high output operation since they are laminates wherein a layer made of a material having high melting point such as Pt is interposed, thus such constitutions are thermally stable.

Figure 4A:
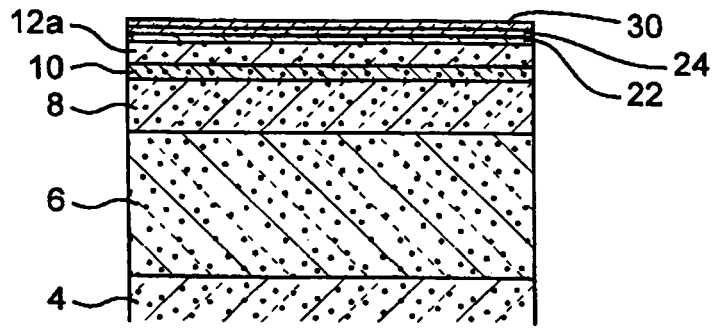
FIG. 4A through 4D are process diagrams showing a method of manufacturing the gallium nitride semiconductor laser device according to the first embodiment.

Now a method of manufacturing the gallium nitride semiconductor laser according to this embodiment will be described. FIG. 4 is a process diagram showing the method of manufacturing the gallium nitride semiconductor laser according to this embodiment. First, as shown in FIG. 4A, after forming a semiconductor layer that constitutes the gallium nitride semiconductor laser device to about a half of the total thickness of the p-side optical guide layer 12 (namely the first p-side optical guide layer 12a) on a wafer in a reaction furnace of a vapor phase growth apparatus such as MOCVD apparatus, the first semiconductor layer 22 made of $In_{x1}Al_{y1}Ga_{1-x1-y1}N$ ($0 \leq x_1 \leq 0.1$, $y_2 < y_1 \leq y_3$, $0 < x_1 + y_1 < 1$) the second semiconductor layer 24 made of $In_{x2}Al_{y2}Ga_{1-x2-y2}N$ ($0 \leq x_2 \leq 1$, $0 \leq y_2 < y_1$, $0 \leq x_2 + y_2 < 1$), and the current blocking layer 30 made of $In_{x3}Al_{y3}Ga_{1-x3-y3}N$ ($0 \leq x_3 \leq 0.1$, $0.5 \leq y_3 \leq 1$, $0.5 \leq x_3 + y_3 \leq 1$) are grown successively.

The first semiconductor layer is preferably grown at a high temperature comparable to that for growing the n-side or p-side cladding layer of the laser, for example 1000° C. or higher. By growing the first semiconductor layer at a high temperature, it is made possible to improve the crystallinity so as to achieve higher durability against etch-back and decrease the resistance so as to improve the efficiency of current injection into the active layer. The second semiconductor layer 24 and the current blocking layer 30, on the other hand, are preferably grown at a low temperature below 1000° C., preferably 600° C. or lower.

Figure 4B:
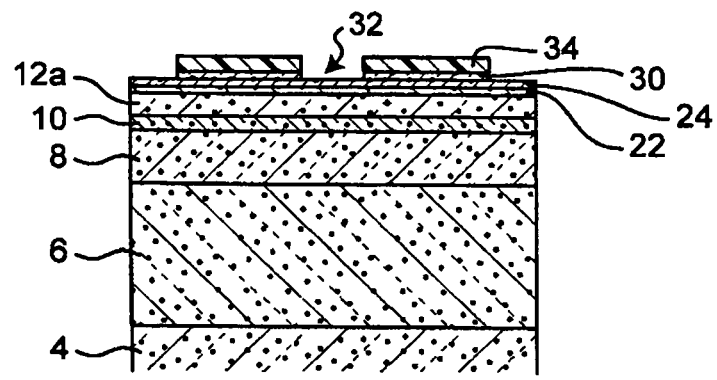

Then as shown in FIG. 4B, the wafer is taken out of the reaction vessel of the vapor phase growth apparatus and the window 32 is formed in the current blocking layer 30 by photolithography using a photo resist 34. Etching of the current blocking layer 30 is preferably carried out by wet etching that is less likely to cause damage to the device, rather than dry etching. The gallium nitride semiconductor having high Al ratio such as AlN, for example, easily dissolves in an alkaline developer solution such as tetramethylammonium hydroxide (TMAH), and therefore can be processed to pattern the current blocking layer 30 by photolithography using an alkaline solution as the developer. The second semiconductor layer 24, on the other hand, has low Al ratio and therefore does not dissolve in an alkaline solution, and functions as an etching stopper layer. At the same time, the second semiconductor layer 24 also protects a portion of the semiconductor layer located in the waveguide from the alkaline solution and the oxygen contained in the atmosphere.

Figure 4C:
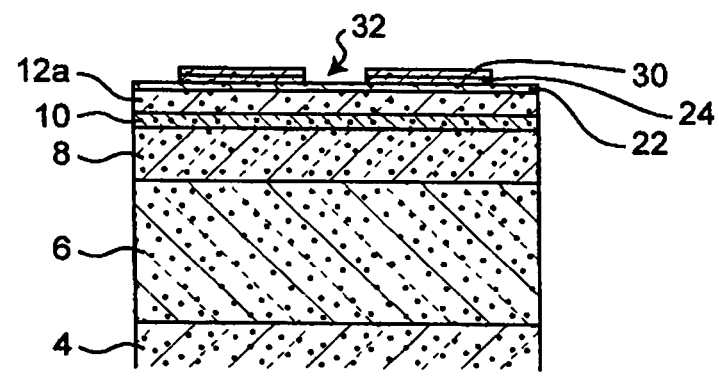

Then as shown in FIG. 4C, after removing the photo resist 34, the wafer is put into the reaction furnace of the vapor phase growth apparatus again, and is kept at a high temperature of 1000° C. or higher while flowing a reducing gas such as hydrogen, so as to carry out etch-back. While the second semiconductor layer 24 has been damaged by oxygen contained in the atmosphere during the process shown in FIG. 4B, it is made of gallium nitride semiconductor having high Al ratio and is therefore easily removed from the portion exposed through the window 32 by etch-back. The first semiconductor layer 22, on the other hand, is made of gallium nitride semiconductor having high Al ratio and therefore does not easily decompose even in a reducing gas such as hydrogen at a high temperature, and functions as the etching stopper layer against etch-back.

Figure 4D:
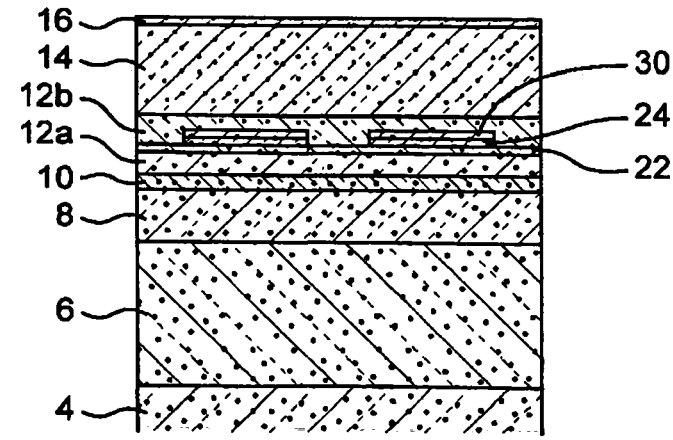

Then as shown in FIG. 4D, the second p-side optical guide layer 12b is grown on the current blocking layer 30 so as to fill the window 32 and make a flat surface. At this time, the window 32 can be easily filled to be flat when the second p-side optical guide layer 12b is made of a nitride semiconductor that essentially does not contain Al, preferably GaN. The second p-side optical guide layer 12b that is the semiconductor used to fill the window 32 of the current blocking layer 30 preferably has refractive index comparable to or lower than that of the first p-side optical guide layer 12a that makes contact with the bottom of the first semiconductor layer. With this constitution, more effective confinement of light can be achieved. Moreover, the second p-side optical guide layer 12b that is the semiconductor used to fill the window 32 of the current blocking layer 30 is preferably grown at such a temperature that is comparable to or higher than that of growing the first p-side optical guide layer 12a that is the layer which makes contact with the bottom of the first semiconductor layer and is suitable for maintaining the crystallinity of the active layer. Higher growing temperature improves the crystallinity of the semiconductor layer which is re-grown while filling in the window, and decreases the resistance. After the second p-side optical guide layer 12b, the p-side cladding layer 14 and the p-side contact layer 16 may be grown successively by the ordinary method of manufacturing the gallium nitride semiconductor laser.

Embodiment 2

While the current blocking layer 30 is formed in the p-side optical guide layer 12 in the first embodiment, the current blocking layer 30 is formed in the n-side optical guide layer 8 in this embodiment. With other respects, this embodiment is similar to the first embodiment.

Figure 6:
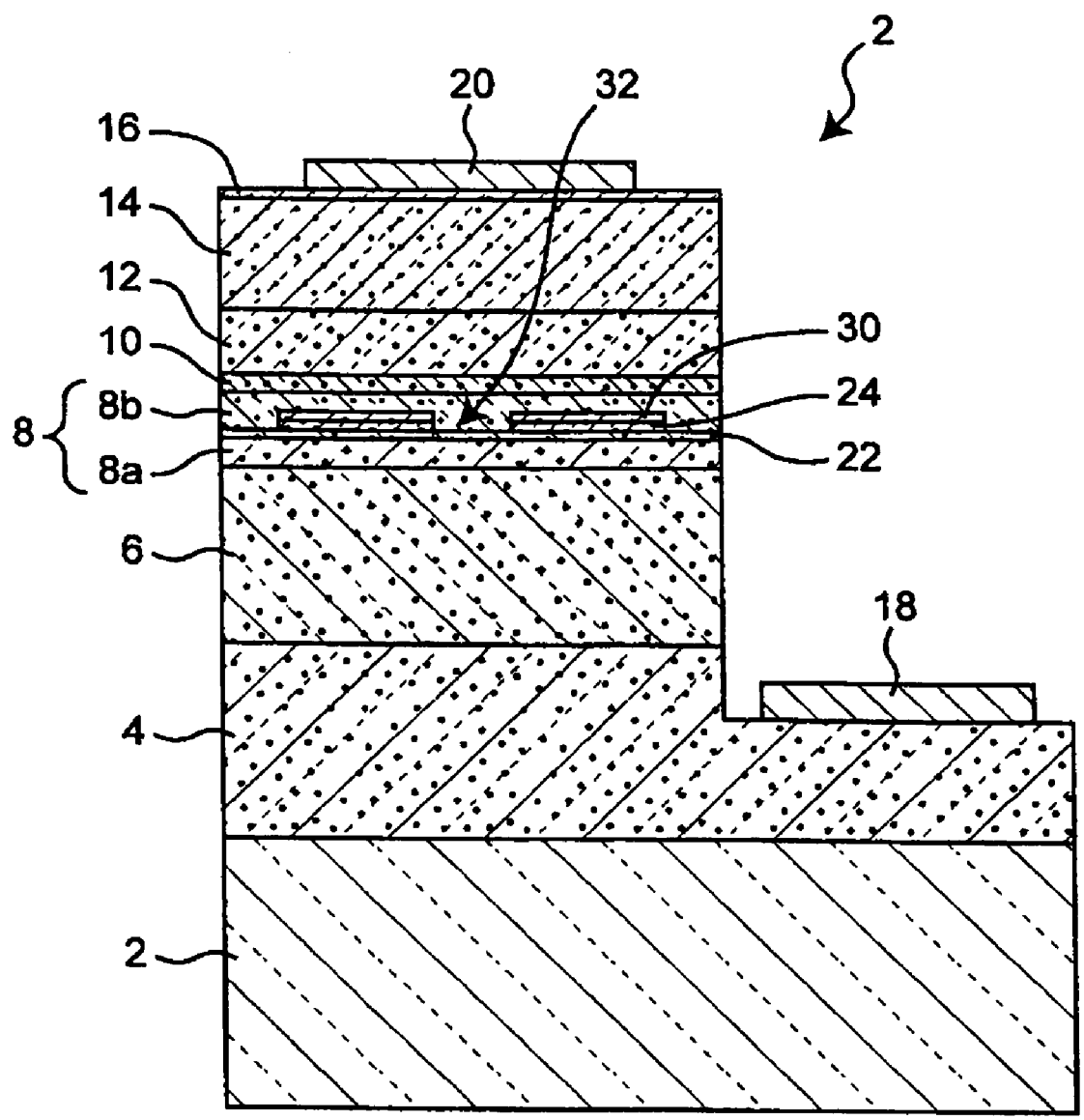
FIG. 6 is a sectional view showing a gallium nitride semiconductor laser according to second embodiment of the invention.

FIG. 6 is a sectional view showing a gallium nitride semiconductor laser according to the second embodiment. In this embodiment, the current blocking layer 30 having the window 32 of stripe configuration is formed in the n-side optical guide layer 8. The current blocking layer 30 is made of $In_{x3}Al_{y3}Ga_{1-x3-y3}N$ ($0 \leq x_3 \leq 0.1$, $0.5 \leq y_3 \leq 1$, $0.5 \leq x_3+y_3 \leq 1$) having high resistivity, and plays the role of controlling the horizontal transverse mode of the laser oscillation by concentrating current in the window 32.

The n-side optical guide layer 8 comprises a first n-side optical guide layer 8a that is located below the current blocking layer 30 and a second n-side optical guide layer 8b. The current blocking layer 30 is formed above the first n-side optical guide layer 8a via the first semiconductor layer 22 and the second semiconductor layer 24, while the window 32 is formed to penetrate the current blocking layer 30 and the second semiconductor layer 24. The second n-side optical guide layer 8b is formed so as to fill the window 32.

Similarly to the first embodiment, the second semiconductor layer 24 is made of gallium nitride semiconductor having lower Al ratio than those of the current blocking layer 30 and the first semiconductor layer, so as to function as an etching stopper layer when the window 32 is formed in the current blocking layer 30 by photolithography and protects the first semiconductor layer 22 from the ambient gas such as oxygen, to be eventually removed in the etch-back process carried out in the vapor phase growth apparatus. The first semiconductor layer 22 functions as the etching stopper layer during the etch-back process carried out before re-growing onto the current blocking layer 30 in the vapor phase growth apparatus, and protects the first n-side optical guide layer 8a located below thereof from gas etching.

Thus in the gallium nitride semiconductor laser according to this embodiment, too, since the first semiconductor layer and the second semiconductor layer act in a complementary manner, the layer formed through reaction with the atmosphere is prevented from remaining in the window of the current blocking layer 30 and defective shape can be prevented from being formed due to excessive etch-back, so that stable laser characteristic can be obtained.

Embodiment 3

In the first embodiment, the second semiconductor layer having lower Al ratio is formed below the current blocking layer, and the first semiconductor layer having higher Al ratio is formed further below thereof, so as to prevent excessive etch-back from occurring by means of the first semiconductor layer. In this embodiment, only a growth base layer having low Al ratio is provided below the current blocking layer, and crystallinity of the growth base layer is controlled to be lower than that of the layer that makes contact with the bottom of the growth base layer, so as to prevent excessive etch-back. With other respects, this embodiment is similar to the first embodiment.

Figure 7:
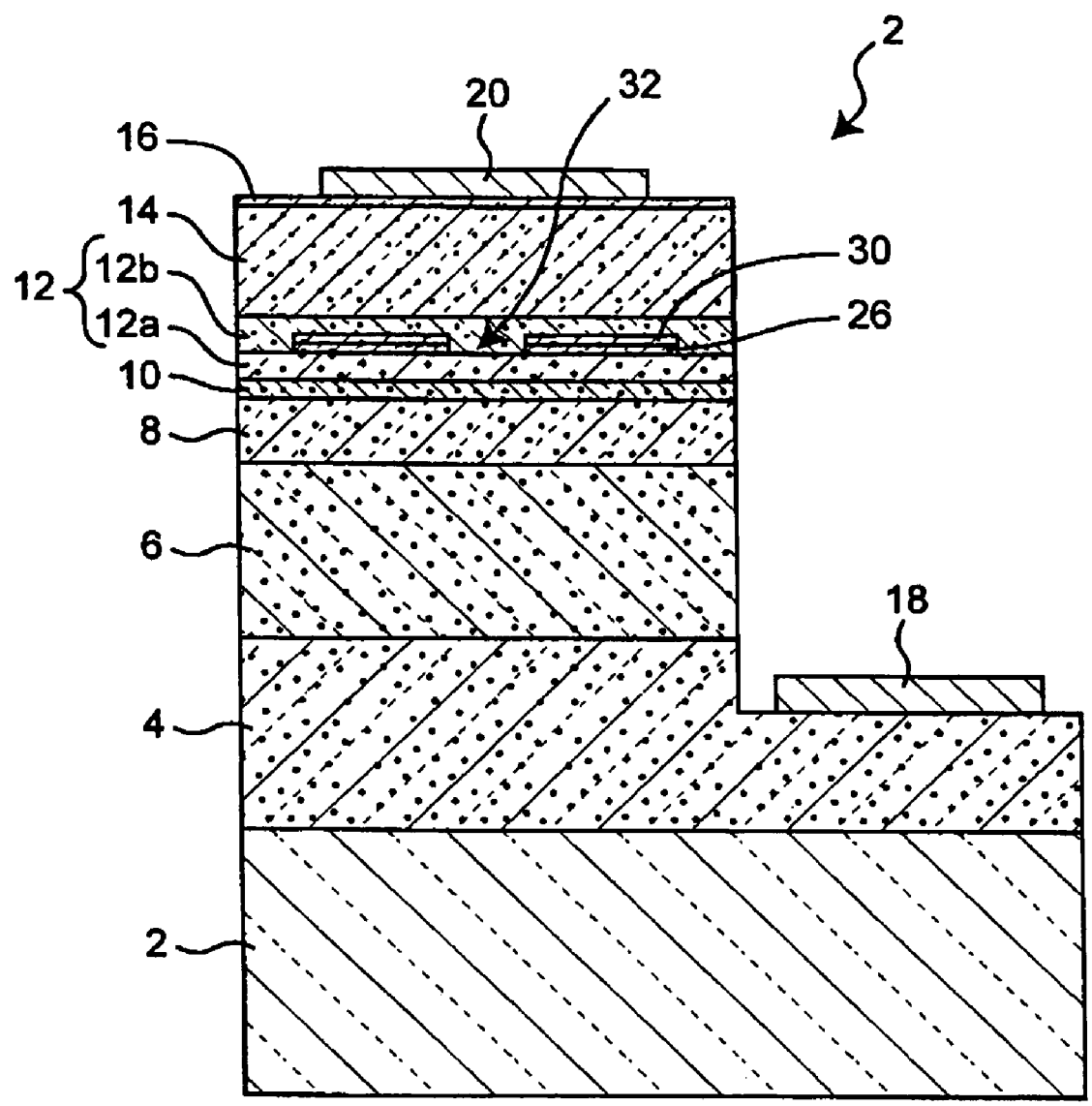
FIG. 7 is a sectional view showing a gallium nitride semiconductor laser device according to third embodiment of the invention.

FIG. 7 is a sectional view showing the gallium nitride semiconductor laser according to the third embodiment, the n-side contact layer 4 made of GaN, the n-side cladding layer 6 made of AlGaN, the n-side optical guide layer 8 made of GaN, the multiple quantum well active layer 10 having a well layer containing In, the p-type optical guide layer 12 made of GaN, the p-side cladding layer 14 made of AlGaN and the p-side contact layer 16 made of GaN are formed on the substrate 2 made of sapphire or the like. Formed in the p-type optical guide layer 12 is the current blocking layer 30 that has the stripe-shaped window 32. The current blocking layer 30 is made of $In_xAl_yGa_{1-x-y}N$ ($0 \leq x \leq 0.1$, $0.5 \leq y \leq 1$, $0.5 \leq x+y \leq 1$) that has high resistivity, so as to concentrate the current in the active layer 10 within the window 32 and control horizontal transverse mode of laser oscillation.

The p-side optical guide layer 12 comprises the first p-side optical guide layer 12a located below the current blocking layer 30 and the second p-side optical guide layer 12b. The current blocking layer 30 is formed on the first p-side optical guide layer 12a via the growth base layer 26, and the window 32 is formed to penetrate the current blocking layer 30 and the growth base layer 26. The second p-side optical guide layer 12b is formed so as to fill in the window 32.

The growth base layer 26 is made of a nitride gallium semiconductor having Al ratio lower than that of the current blocking layer 30, so as to function as an etching stopper layer when the window 32 is formed in the current blocking layer 30 by photolithography and also protect the p-type optical guide layer 12a located below thereof from ambient gas such as oxygen, before eventually being removed by etch-back carried in a vapor phase growth apparatus.

This is because the growth base layer 26 has low Al ratio (preferably 0.05 or less), and it is etched with an alkaline solution at a rate different from that of the current blocking layer 30 that has Al ratio of 0.5 or higher, and therefore remains without being etched when the current blocking layer 30 is etched with alkaline solution. Thus when the window 32 is formed in the current blocking layer 30, the growth base layer 26 serves as the etching stopper layer and prevents excessive etching. Also because the growth base layer 26 is made of the nitride gallium semiconductor having low Al ratio, it reacts with oxygen and other elements contained in air only at a slow rate. Therefore, the growth base layer 26 can effectively protect the first p-side optical guide layer 12a located thereunder from the ambient gas such as oxygen in the photolithography process carried out outside the vapor phase growth apparatus.

In the meantime, the growth base layer 26 is damaged on the surface thereof through the etching process by the photolithography and through exposure to the atmosphere. However, because the growth base layer 26 is made of a nitride semiconductor that essentially does not contain Al, it easily decomposes when exposed to a reducing gas such as hydrogen at a high temperature. As a result, the growth base layer 26 that has been damaged can be easily removed from the window 32 that becomes the current path, by etching back in the vapor phase growth apparatus.

However, if there is not a difference in the etching rate between the growth base layer 26 and the first p-side optical guide layer 12a, etch-back tends to proceed excessively in the first p-side optical guide layer 12a. In this embodiment, therefore, the growth base layer 26 is made with lower crystallinity than the first p-side optical guide layer that makes contact with the bottom thereof, thereby generating a difference in the etching rate for etch-back between these layers. That is, by making the growth base layer 26 with lower crystallinity than the first p-side optical guide layer, etch-back is caused to proceed fast in the growth base layer 26 and slowly in the first p-side optical guide layer 12a. This makes it possible to selectively remove the growth base layer 26 only.

Thus in the gallium nitride semiconductor laser according to this embodiment, too, the layer formed through reaction with the atmosphere is prevented from remaining in the window of the current blocking layer 30 and defective shape can be prevented from being formed due to excessive etch-back, so that stable laser characteristic can be obtained.

The growth base layer 26 is made of gallium nitride semiconductor having lower Al ratio that the current blocking layer 30, namely a gallium nitride semiconductor having a composition represented by the general formula $In_{x'}Al_{y'}Ga_{1-x'-y'}N$ ($0 \leq x' \leq 1$, $0 \leq y' < y$, $0 \leq x'+y' < 1$). The lower the Al ratio in the growth base layer 26, the greater the difference in etching rate in the wet etching process from the current blocking layer 30, thus making it easier to remove by etch-back. It is preferable to control the Al ratio $y_4$ in the growth base layer 26 to 0.1 or lower, preferably to 0.05 or lower, and more preferably to essentially zero.

The growth base layer 26 preferably contains In. When the growth base layer 26 contains In, selective etch-back becomes easy and the effect of absorbing stray light leaking from the waveguide can also be achieved. In ratio x' in the growth base layer 26 is preferably from 0 to 0.2, and more preferably 0.05 to 0.15. Thus preferable composition of the growth base layer 26 is $In_fGa_{1-f}N$ ($0 \leq f \leq 0.2$)

In order to make the crystallinity of the growth base layer 26 lower than that of the layer that makes contact therewith from below, for example, In ratio in the growth base layer may be made higher than that of the layer that makes contact therewith from below, or the growth base layer may be grown at a lower temperature than the layer that makes contact therewith from below. The higher the In ratio of the growth base layer 26, the faster it decomposes when exposed to reducing atmosphere such as hydrogen at a high temperature. As a result, the growth base layer 26 can be selectively removed when the In ratio of the growth base layer 26 is higher than that of the first p-side optical guide layer 12a. The lower the growing temperature of the growth base layer 26, on the other hand, the faster it decomposes when exposed to reducing atmosphere such as hydrogen at a high temperature. As a result, the growth base layer 26 can be selectively removed even when the growth base layer 26 and the first p-side optical guide layer 12a are made of GaN of the same composition. Crystallinity of the growth base layer 26 can be made low also by making the impurity concentration thereof higher than the layer that makes contact therewith from below.

Capability of the growth base layer 26 to absorb stray light from the active layer can be increased by forming the growth base layer 26 with higher impurity concentration (for example, $5 \times 10^{18}/cm^3$ or higher) or containing In. This makes it possible to suppress the oscillation in higher mode and generate stable laser beam of single mode.

When selective etch-back is carried out by lowering the growing temperature of the growth base layer 26, the growing temperature is preferably set to 900° C. or lower, and more preferably 600° C. or lower. As the means for lowering the crystallinity of the growth base layer 26, both means of increasing the In ratio and lowering the growing temperature may be used in combination. The growth base layer 26 is preferably made in amorphous or polycrystalline structure. By making the growth base layer 26 in amorphous or polycrystalline structure, it becomes easier to remove than single crystal. Also because resistivity of the growth base layer becomes higher, better current blocking effect can be achieved through combined effect of the high resistivity and the current blocking layer formed in contact thereon. It is also made possible to make the current blocking layer thinner.

Forming the growth base layer 26 with low crystallinity also has such an effect that it becomes easier to remove the current blocking layer 30 that is grown thereon. When the layer that makes contact with the bottom of the current blocking layer 30 is good, a part of the current blocking layer 30 near the interface has good crystallinity and becomes difficult to remove by etching. Accordingly, the current blocking layer 30 has low crystallinity from the early stage of growth and it becomes easier to remove the current blocking layer 30 from within the window 32, by forming the growth base layer 26 that makes contact with the bottom of the current blocking layer 30 with low crystallinity.

The growth base layer 26 cannot protect the first p-type optical guide layer 12a sufficiently when it is too thin, and allows the step to cause greater influence when it is too thick. When the step is larger, it becomes difficult to form the semiconductor layer to be re-grown on the current blocking layer with flat surface. Therefore, the thickness of the growth base layer 26 is preferably from 10 to 300 Å, and more preferably from 50 to 200 Å.

The layer that makes contact with the bottom of the growth base layer 26 is preferably an optical guide layer. It becomes easier to control the confinement of light by forming the current blocking structure so as to make contact with the optical guide layer.

Now a method of manufacturing the gallium nitride semiconductor laser according to this embodiment will be described.

FIG. 8 is a process diagram showing the method of manufacturing the gallium nitride semiconductor laser according to the third embodiment. First, as shown in FIG. 8A, after forming a semiconductor layer that constitutes the gallium nitride semiconductor laser device to about a half of the total thickness of the p-side optical guide layer 12 (namely the first p-side optical guide layer 12a) on a wafer in the reaction furnace of the vapor phase growth apparatus such as MOCVD apparatus, the growth base layer 26 made of $In_xAl_yGa_{1-x'-y'}N$ ($0 \leq x' \leq 1$, $0 \leq y' \leq y$, $0 \leq x'+y' < 1$) and the current blocking layer 30 made of $In_xAl_yGa_{1-x-y}N$ ($0 \leq x \leq 0.1$, $0.5 \leq y \leq 1$, $0.5 \leq x+y \leq 1$) are grown successively. The growth base layer 26 is formed with lower crystallinity than that of the first p-side optical guide layer 12a by either increasing the In ratio or lowering the growing temperature.

Figure 8A:
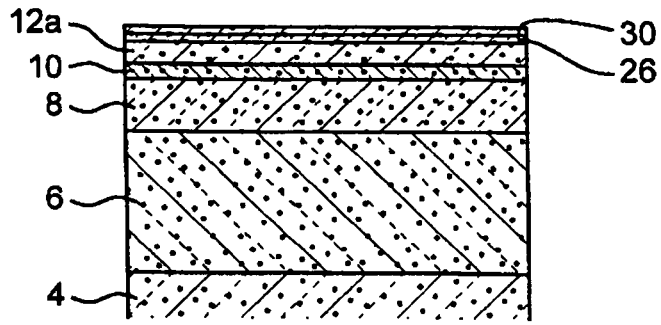
FIG. 8A through 8D are process diagrams showing a method of manufacturing the gallium nitride semiconductor laser device according to the third embodiment.
Figure 8B:
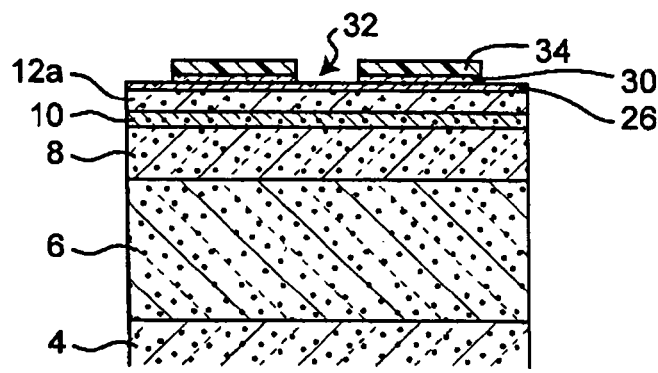

Then as shown in FIG. 8B, the wafer is taken out of the reaction furnace of the vapor phase growth apparatus and the window 32 is formed in the current blocking layer 30 by photolithography using the photo resist 34. Patterning of the current blocking layer 30 is preferably carried out by photolithography using an alkaline developer solution such as tetramethylammonium hydroxide (TMAH). The growth base layer 26 has low Al ratio and is therefore difficult to dissolve in tetramethylammonium hydroxide (TMAH), so as to function as an etching stopper layer. At the same time, the growth base layer 26 also protects the portion of the semiconductor layer located in the waveguide from oxygen contained in the atmosphere.

Figure 8C:
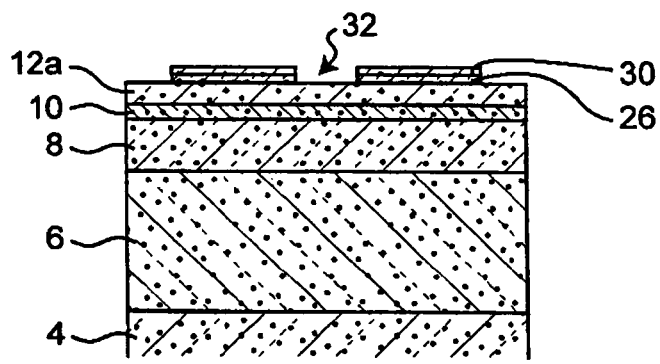

Then as shown in FIG. 8C, after removing the photo resist 34, the wafer is put into the reaction furnace of the vapor phase growth apparatus again and is kept at a high temperature of 1000° C. or higher while flowing a reducing gas such as hydrogen, so as to carry out etch-back. While the growth base layer 26 has been damaged by oxygen or other element contained in the atmosphere during the process shown in FIG. 8B, it is formed so as to have lower crystallinity than the first p-side optical guide layer 12a and therefore the portion thereof exposed through the window 32 is selectively removed by etch-back. At this time, the first p-side optical guide layer 12a functions as the etching stopper layer against etch-back.

Figure 8D:
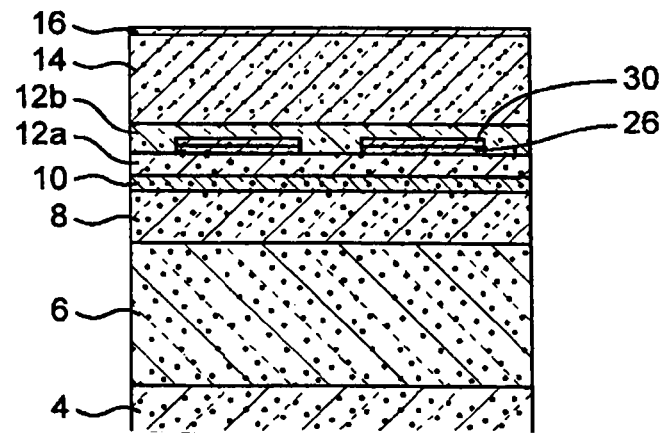

Then as shown in FIG. 8D, the second p-side optical guide layer 12b is grown on the current blocking layer 30 so as to fill the window 32 to make a flat surface. At this time, the window 32 can be easily filled to be flat when the second p-side optical guide layer 12b is made of a nitride semiconductor that essentially does not contain Al, preferably GaN. The second p-side optical guide layer 12b that is the semiconductor used to fill the window of the current blocking layer 30 preferably has refractive index comparable to or lower than that of the first p-side optical guide layer 12a that makes contact with the bottom of the growth base layer. With this constitution, more effective confinement of light can be achieved. Moreover, the second p-side optical guide layer 12b that is the semiconductor used to fill the window of the current blocking layer 30 is preferably grown at such a temperature that is comparable to or higher than that of the layer that makes contact with the bottom of the growth base layer and is suitable for maintaining the crystallinity of the active layer. Higher growing temperature improves the crystallinity of the semiconductor layer which is re-grown while filling in the window, and decreases the resistance. After the second p-side optical guide layer 12b, the p-side cladding layer 14 and the p-side contact layer 16 may be grown successively by the ordinary method of manufacturing the gallium nitride semiconductor laser.

Embodiment 4

While the current blocking layer 30 is formed in the p-side optical guide layer 12 in the third embodiment, the current blocking layer 30 is formed in the n-side optical guide layer 8 in this embodiment. With other respects, this embodiment is similar to the third embodiment.

Figure 9:
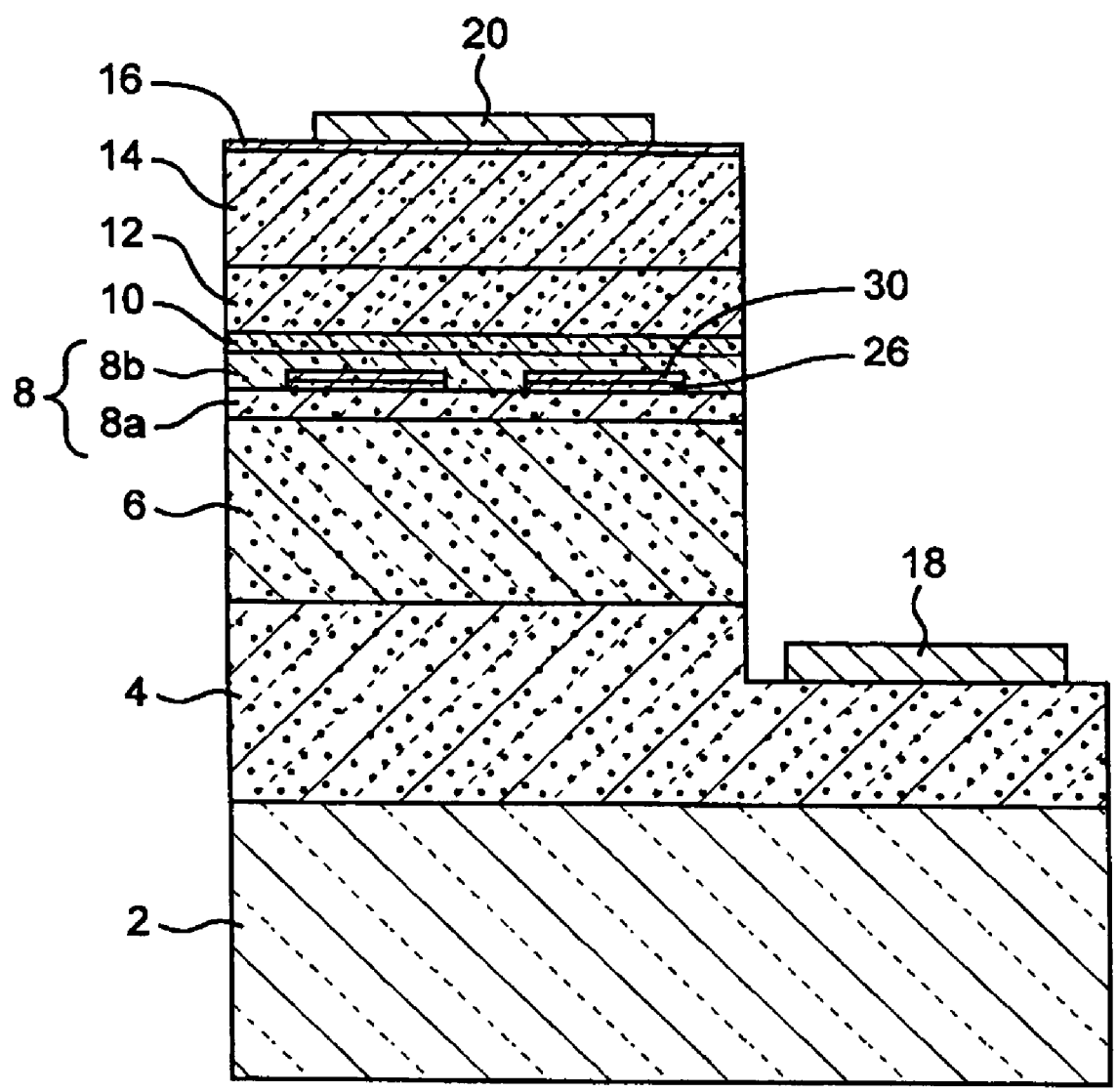
FIG. 9 is a sectional view showing a gallium nitride semiconductor laser according to fourth embodiment of the invention.

FIG. 9 is a sectional view showing a gallium nitride semiconductor laser according to the fourth embodiment. In this embodiment, the current blocking layer 30 having the window 32 of stripe configuration is formed in the n-side optical guide layer 8. The current blocking layer 30 is made of $In_xAl_yGa_{1-x-y}N$ ($0 \leq x \leq 0.1$, $0.5 \leq y \leq 1$, $0.5 \leq x+y \leq 1$) having high resistivity, and plays the role of controlling the horizontal transverse mode of the laser oscillation by concentrating current in the window 32.

The n-side optical guide layer 8 comprises the first n-side optical guide layer 8a that is located below the current blocking layer 30 and the second n-side optical guide layer 8b. The current blocking layer 30 is formed above the first n-side optical guide layer 8a via the growth base layer 26, and the window 32 is formed to penetrate the current blocking layer 30 and the growth base layer 26. The second n-side optical guide layer 8b is formed so as to fill the window 32.

Similarly to the third embodiment, the growth base layer 26 is formed from nitride semiconductor that essentially does not contain Al, so as to have lower crystallinity than the first n-side optical guide layer 8a. Thus the growth base layer 26 functions as an etching stopper layer when the window 32 is formed in the current blocking layer 30 by photolithography and protects the first n-side optical guide layer 8a from the ambient gas such as oxygen, to be eventually removed selectively in the etch-back process carried out in the vapor phase growth apparatus.

Thus in the gallium nitride semiconductor laser according to this embodiment, too, the layer formed through reaction with the atmosphere is prevented from remaining in the window of the current blocking layer 30 and defective shape can be prevented from being formed due to excessive etch-back, so that stable laser characteristic can be obtained.

Embodiment 5

Figure 10:
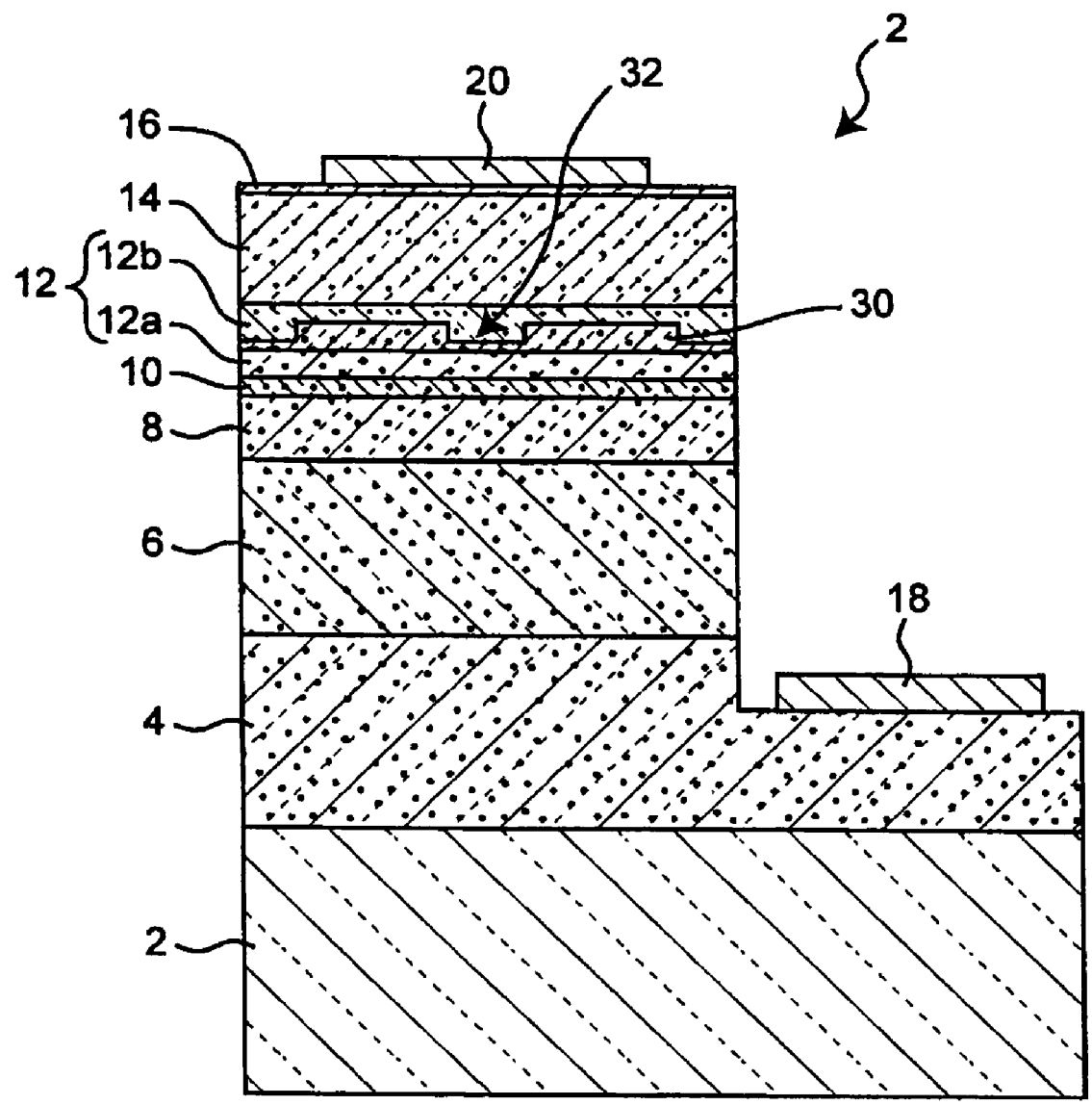
FIG. 10 is a sectional view showing a gallium nitride semiconductor laser device according to fifth embodiment of the invention.

FIG. 10 is a sectional view showing the gallium nitride semiconductor laser according to this embodiment, The n-side contact layer 4 made of GaN, the n-side cladding layer 6 made of AlGaN, the n-side optical guide layer 8 made of GaN, the multiple quantum well active layer 10 having a well layer containing In, the p-type optical guide layer 12 made of GaN, the p-side cladding layer 14 made of AlGaN and the p-side contact layer 16 made of GaN are formed on the substrate 2 made of a different material such as sapphire. Formed in the p-side optical guide layer 12 is the current blocking layer 30 that has the stripe-shaped window 32. The current blocking layer 30 is made of gallium nitride semiconductor that has Al ratio of 0.5 or higher and high resistivity, so as to concentrate the current in the active layer 10 within the window 32 and control horizontal transverse mode of laser oscillation.

Figure 11A:
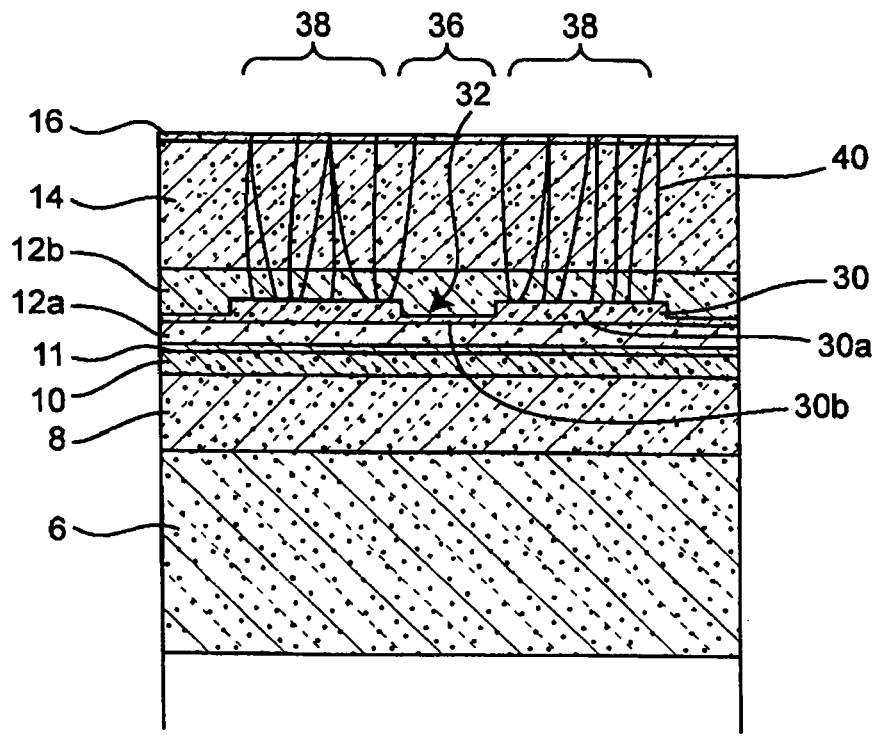
FIGS. 11A and 11B are partially enlarged sectional views showing the gallium nitride semiconductor laser device according to the fifth embodiment.
Figure 11B:
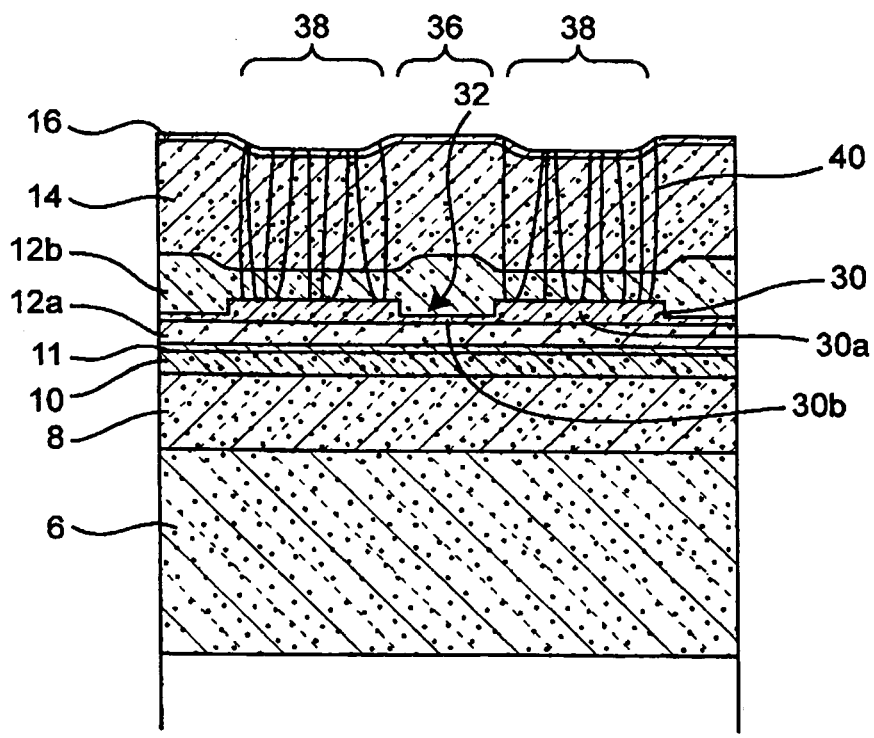

FIGS. 11A and 11B are partially enlarged sectional views showing the structure of a region in the vicinity of the current blocking layer 30 in more detail. As shown in FIG. 11A, the carrier confinement layer 11 made of gallium nitride semiconductor containing Al is formed in a thin film of 50 to 200 Å on the active layer 10 made of gallium nitride semiconductor, and the p-type optical guide layer 2 made of GaN is formed thereon. The p-type optical guide layer 12 comprises the first p-type optical guide layer 12a located below the current blocking layer 30 and the second p-type optical guide layer 12b. The current blocking layer is formed on the first p-type optical guide layer 12a and the window 32 is formed in the current blocking layer 30. The second p-type optical guide layer 12b is formed so as to fill in the window 32.

The current blocking layer 30 blocks the current in a portion 30a that encloses the window (hereafter called the main portion), and causes the current to flow through the window 32 into the active layer. The main portion 30a of the current blocking layer is not only high in resistance but is also extremely low in crystallinity on the surface because of the Al ratio as high as 0.5. As a result, as shown schematically in FIG. 11A, dislocations 40 occur with a high density also in the p-side cladding layer 14 and in the p-side contact layer 16 formed above the main portion 30a of the current blocking layer, thus making it difficult for current to flow therein. That is, the current blocking layer 30 has current blocking effect in the semiconductor layer located above the main portion 30a due to low crystallinity thereof, in addition to the current blocking effect due to the resistance of the main portion 30a. Therefore, even when the current blocking layer 30 is formed with a relatively small thickness of several hundreds of angstrom, it has sufficient current blocking effect through the combined effect of high resistance and low crystallinity.

The window 32 of the current blocking layer 30 is formed so that a portion of the current blocking layer 30 that contacts the first p-side optical guide layer 12a, which is the base layer, remains with a thickness of 10 Å or more. The portion of the current blocking layer remaining in the window 32 (hereafter referred to simply as the remaining film portion) 30b has good crystallinity due to the influence of good crystallinity of the first p-side optical guide layer 12a, that is the base layer, and has therefore low resistance. As the result of good crystallinity, substantially no dislocations occur above the remaining film portion 30b of the current blocking layer, as shown in FIG. 11A. Thus current can be injected efficiently into the active layer within the window 32, despite the presence of the remaining film portion 30b of the current blocking layer that has high Al ratio.

In the meantime, since the remaining film portion 30b of the current blocking layer has high Al ratio and good crystallinity, it decomposes very slowly in the reducing atmosphere such as hydrogen, and functions as the etching stopper layer when the oxide layer or the like is removed from the wafer surface by etch-back prior to re-growth. Although the remaining film portion 30b of the current blocking layer 30 is also decomposed by the etch-back using hydrogen or the like, the rate of decomposition is very slow and therefore even the etch-back process that is carried out for a sufficient period of time to completely remove the oxide layer or the like formed on the surface of the current blocking layer 30 does not penetrate the remaining film portion 30b of the current blocking layer 30 and erode the p-side guide layer 12a located below.

Since sufficient etching stopper function cannot be obtained when the remaining film portion 30b of the current blocking layer is too thin, a mean thickness remaining after etch-back is set to 10 Å or more, preferably 30 Å or more. When the remaining film portion 30b of the current blocking layer is too thick, crystallinity of the remaining film portion 30b becomes lower and, as a result, resistance increases and/or dislocations occur, resulting in higher threshold current of laser oscillation. Therefore, a mean thickness remaining after etch-back of the remaining film portion 30b is preferably less than 100 Å, and more preferably less than 70 Å.

Since excessive etching is prevented by the remaining film portion 30b of the current blocking layer, flatness of the layer formed on the current blocking layer 30 and the device characteristics are improved as shown in FIG. 11A. Decrease in the step caused by leaving the remaining film portion 30b and low crystallinity of the main portion 30a of the current blocking layer 30 also contribute to the improvement in flatness, in addition to the etching stopping effect of the remaining film portion 30b. That is, as the step in the window 32 of the current blocking layer is decreased by leaving the remaining film portion 30b, it is made easier to eliminate the step by filling with the second p-type optical guide layer 12b. Also the crystal grows at a faster rate in a region 36 located above the remaining film portion 30b than in the region 38 located above the main portion 30a, since the main portion 30a of the current blocking layer has lower crystallinity and the remaining film portion 30b has good crystallinity. As a result, as shown in FIG. 11A, the window 32 which is a recess can be easily filled and made flat with the second p-side optical guide layer 12b.

As the second p-side optical guide layer 12b is formed flat, compositions of the p-side cladding layer 14 and the p-side contact layer 16 formed thereon can be restricted from becoming uneven, so that the functions of the layers are improved. In case the p-side cladding layer 14 has super lattice structure, in particular, the super lattice structure is disturbed when there is a step on the surface of the second p-side optical guide layer 12b that is the base layer, and therefore it is important that the second p-side optical guide layer 12b fills the window 32 to make a flat surface.

Moreover, the device layers (the second p-side optical guide layer, the p-side cladding layer and the p-side contact layer) in the region 36 above the remaining film portion 30b may also be formed to be thicker than the region 38 located above the main portion 30a, as shown in FIG. 11B. Since the main portion 30a of the current blocking layer has low crystallinity, crystal grows faster in the region 36 located above the remaining film portion 30b than in the region 38 located above the main portion 30a. As a result, the device layers in the region 36 located above the remaining film portion 30b can be made thicker than the surrounding area if the difference in growing rate becomes greater. Since the device layers in the region 36 located above the remaining film portion 30b constitute the core portion that surrounds the active region of the laser, it is advantageous for confinement of light to make this portion thicker.

Such a film thickness distribution as shown in FIG. 11A or 11B can be obtained by controlling the crystallinity of the main portion 30a and the remaining film portion 30b of the current blocking layer. Crystallinity of these layers can be controlled by means of such factors as the Al ratio in the current blocking layer 30, growing temperature, total thickness, thickness of the remaining film portion 30b, crystallinity of the base layer. The better the crystallinity of the base layer of the current blocking layer and the thinner the remaining film portion 30b, the higher the crystallinity of the remaining film portion 30b of the current blocking layer becomes.

The current blocking layer 30 is preferably carried out at a low temperature so that the main portion 30a has low crystallinity in the surface thereof. The growing temperature is, for example, preferably 900° C. or lower and more preferably 600° C. or lower. Growing the current blocking layer 30 at a low temperature makes it easier to process it by etching with an alkaline solution or the like and improves the current blocking effect. When the main portion 30a of the current blocking layer 30 is too thin, it cannot perform the current blocking function sufficiently and, when it is too thick, on the other hand, influence of the step becomes greater. Thus a total thickness of the current blocking layer 30 (that is the thickness of the main portion 30a) is preferably from 100 to 800 Å, and more preferably from 150 to 500 Å.

The current blocking layer 30 is formed on a base layer that has crystallinity higher than at least that of the current blocking layer 30 itself. Crystallinity better than that of the current blocking layer, of which purpose is insulation, can be obtained as long as the layer constitutes an ordinary gallium nitride semiconductor laser and is formed in the current path.

It is also preferable to form the current blocking layer 30 except for the residual film so that the end face thereof in the longitudinal direction 30a is located inward from the end face 2a of the resonator of the laser device 2, as shown in FIG. 5. When the current blocking layer 30 is formed short of the end face 2a of the resonator, energy density at the end face 2a of the resonator becomes lower and COD (catastrophic optical damage) characteristic can be improved. There is also such a benefit that defective shape and cracks are less likely to occur in the waveguide when forming the end face of resonator by RIE or cleavage. In case the resonator surface is formed by etching, it becomes easier to form a flat resonator surface when the current blocking layer 30 is formed apart from the end face of the resonator. This is because, since certain level of step is generated in the window of the current blocking layer 30, it becomes difficult to form flat etching surface due to the influence of the step when the current blocking layer 30 reaches the end face of the resonator. As for the remaining film portion of the current blocking layer, there is not problem if it is formed to reach the end face of the resonator 2a, since it is a thin film where current flows.

Side face of the current blocking layer 30 in the lateral direction is also preferably formed inward of the side face of the laminate that constitutes the stripe structure of the laser device 2 as shown in FIG. 5. The current blocking layer having high Al ratio is difficult to etch uniformly, and is likely to have rough surface formed by etching. As a result, in case the current blocking layer has been formed with the same area as the other nitride semiconductor layers, etching the laminate of the nitride semiconductor layers to form an n electrode may cause rough etching surface and higher connection resistance of the n electrode. If the current blocking layer 30 is formed within a region inward from the side face of the stripe structure, it becomes easier to carry out etching to form the n electrode and the resistance decreases.

In the meantime, the current blocking layer has high Al ratio and therefore has lattice constant and thermal expansion coefficient that are significantly different from those of the layers located above and below thereof. When the current blocking layer 30 is formed within a region apart from the end face and/or the side face of the laminate that constitutes the stripe structure to such an extent that does not affect the current blocking effect and the light confinement function, namely within the inner region, strain can be reduced and cracks can be suppressed from occurring.

Now a method of manufacturing the gallium nitride semiconductor laser according to this embodiment will be described.

Figure 12A:
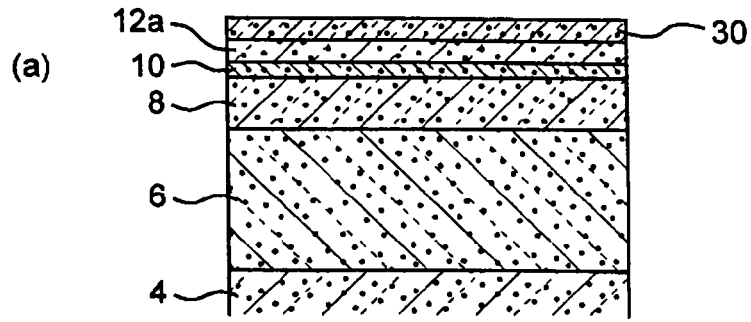
FIG. 12A through 12D are process diagrams showing a method of manufacturing the gallium nitride semiconductor laser device according to the fifth embodiment.
Figure 12B:
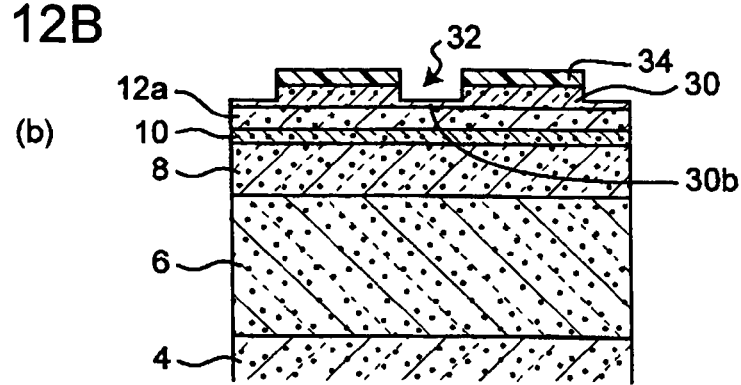
Figure 12C:
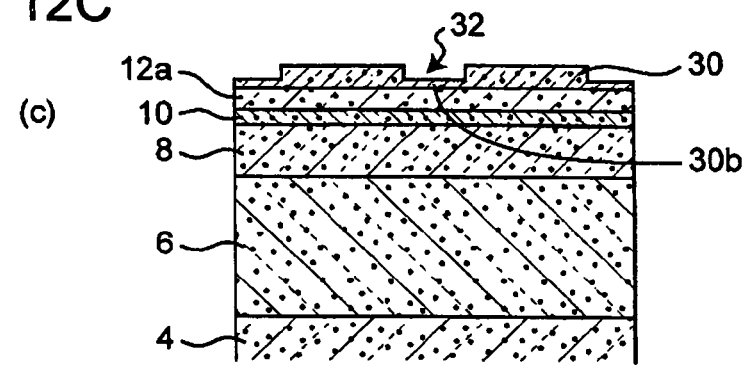
Figure 12:
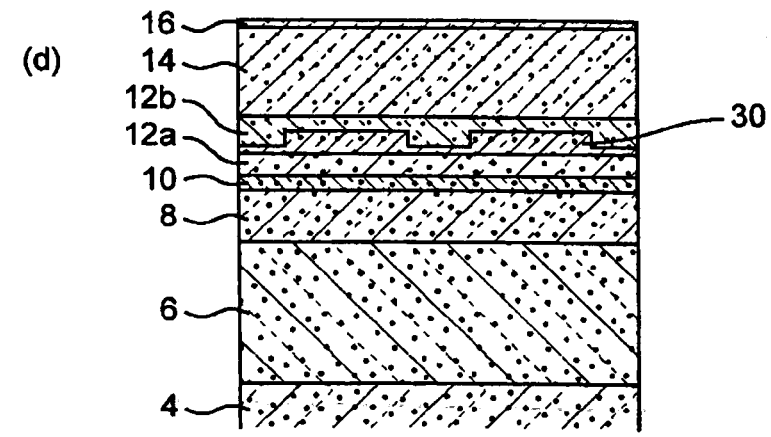

FIG. 12 is a process diagram showing the method of manufacturing the gallium nitride semiconductor laser according to this embodiment. First, as shown in FIG. 12A, after forming a semiconductor layer that constitutes the gallium nitride semiconductor laser to about a half of the total thickness of the p-side optical guide layer 12 (namely the first p-side optical guide layer 12a) in the reaction furnace of the vapor phase growth apparatus such as MOCVD apparatus, the current blocking layer 30 made of $In_xAl_yGa_{1-x-y}N$ ($0 \leq x \leq 0.1$, $0.5 \leq y \leq 1$, $0.5 \leq x+y \leq 1$) is grown. The current blocking layer 30 is formed preferably grown at a low temperature lower than 1000° C. and more preferably 600° C. or lower.

Then as shown in FIG. 12B, the wafer is taken out of the reaction furnace of the vapor phase growth apparatus and the window 32 is formed in the current blocking layer 30 by photolithography using the photo resist 34. Etching of the current blocking layer 30 is preferably carried out by wet etching that causes less damage, rather than dry etching. Since the gallium nitride semiconductor having high Al ratio such as AlN easily dissolves in an alkaline developer solution such as tetramethylammonium hydroxide (TMAH), patterning of the current blocking layer 30 can be done by photolithography using an alkaline solution as the developer solution.

The window 32 in the current blocking layer 30 is formed in such a manner that a portion of predetermined thickness of the current blocking layer 30 remains as the remaining film portion 30b in the window 32. This can be achieved by making use of the change in crystallinity of the current blocking layer in the direction of thickness. Crystallinity of the current blocking layer is good in he portion in contact with the first p-side optical guide layer 12a that is the base layer, and becomes lower with the distance from the base layer. As a result, the current blocking layer is etched by alkaline solution or the like at different rates between the portion near the base layer and the portion located above, and only the portion of the current blocking layer near the base layer can be left to remain by properly setting the etching conditions such as concentration and temperature of the alkaline solution.

Then as shown in FIG. 12C, after removing the photo resist 34, the wafer is put into the reaction furnace of the vapor phase growth apparatus again and is kept at a high temperature of 1000° C. or higher while flowing a reducing gas such as hydrogen, so as to carry out etch-back. The layer formed through reaction of the surface of the semiconductor layer (namely the current blocking layer 30) and oxygen and other element in the atmosphere is removed by etch-back in the process shown in FIG. 12B.

At this time, the remaining film portion 30b of the current blocking layer functions as the etching stopper layer. That is, since the remaining film portion 30b of the current blocking layer has high Al ratio and good crystallinity, it decomposes slowly in reducing atmosphere such as hydrogen. Therefore, even the etch-back process that is carried out for a sufficient period of time to completely remove the oxide layer or the like formed on the surface of the current blocking layer 30 does not penetrate the remaining film portion 30b of the current blocking layer 30 to erode the p-side guide layer 12a located below.

Then as shown in FIG. 12D, the second p-side optical guide layer 12b is grown on the current blocking layer 30 so as to fill the window 32 to make a flat surface. At this time, the window 32 can be easily filled to be flat when the second p-side optical guide layer 12b is made of a nitride semiconductor that essentially does not contain Al, preferably GaN. After the second p-side optical guide layer 12b, the p-side cladding layer 14 and the p-side contact layer 16 may be grown successively by the ordinary method of manufacturing the gallium nitride semiconductor laser.

Embodiment 6

While the current blocking layer 30 is formed in the p-side optical guide layer 12 in the fifth embodiment, the current blocking layer 30 is formed in the n-side optical guide layer 8 in this embodiment. With other respects, this embodiment is similar to the fifth embodiment.

Figure 13:
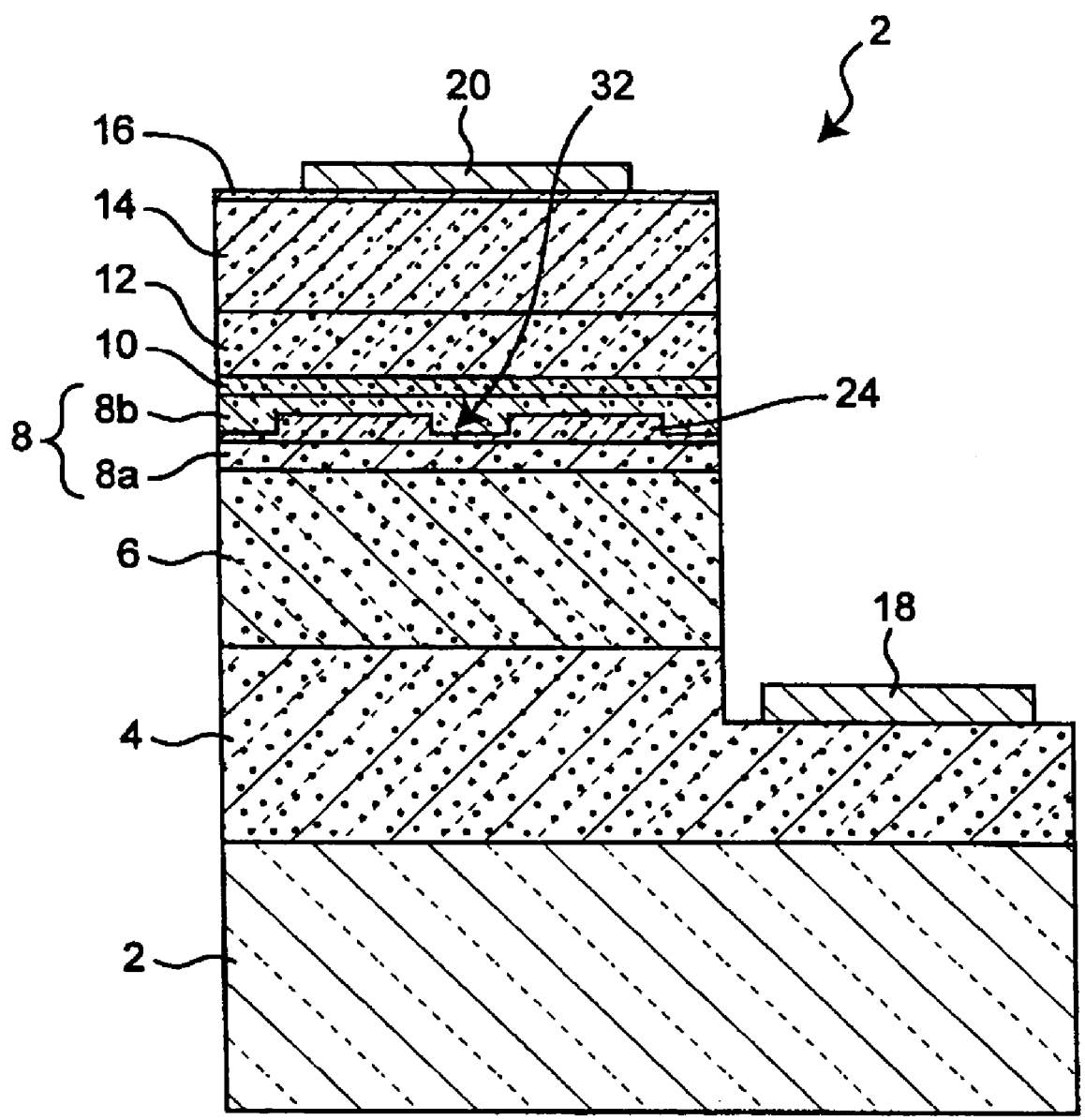
FIG. 13 is a sectional view showing a gallium nitride semiconductor laser according to sixth embodiment of the invention.

FIG. 13 is a sectional view showing a gallium nitride semiconductor laser according to the sixth embodiment. In this embodiment, the current blocking layer 30 having the window 32 of stripe configuration is formed in the n-side optical guide layer 8. The current blocking layer 30 is made of $In_xAl_yGa_{1-x-y}N$ ($0 \leq x \leq 0.1$, $0.5 \leq y \leq 1$, $0.5 \leq x+y \leq 1$) having high resistivity, and plays the role of controlling the horizontal transverse mode of the laser oscillation by concentrating current in the window 32.

The n-side optical guide layer 8 comprises the first n-side optical guide layer 8a that is located below the current blocking layer 30 and the second n-side optical guide layer 8b. The current blocking layer 30 is formed above the first n-side optical guide layer 8a, and the window 32 is formed so that the portion of a predetermined thickness of the current blocking layer 30 near the base layer remains. Then the second n-side optical guide layer 8b is formed so as to fill the window 32.

Similarly to the fifth embodiment, the remaining film portion 30b of the current blocking layer functions as an etching stopper layer during the etch-back process carried out prior to re-growing onto the current blocking layer 30 in the vapor phase growth apparatus, and also decreases the step in the window 32. Since the remaining film portion 30b of the current blocking layer has low resistance and good crystallinity, it does not block the current injection into the active layer 10. Consequently, excellent laser characteristic can be achieved stably with the gallium nitride semiconductor laser of this embodiment.

As described in the first and sixth embodiments, the current blocking layer 30 may be formed either on the p side or n side of the active layer according to the present invention. With ordinary gallium nitride semiconductor, since the p-type gallium nitride semiconductor has high resistivity, n-side layer, active layer and p-side layer are grown in this order. Therefore, in case the current blocking layer 30 is formed on n side of the active layer as in the second, fourth and sixth embodiments, dislocations originating in the current blocking layer 30 of low crystallinity pass through the active layer 10. When satisfactorily flat surface is not formed with the second n-side optical guide layer 8b, the active layer 10 cannot be formed flat and leakage current is likely to flow. For these reasons, it is preferable to form the current blocking layer on the p side of the active layer as in the first, third and fifth embodiments. When the current blocking layer is formed on the p side of the active layer, current flow into the active layer can be efficiently controlled and therefore the laser can oscillate efficiently. Also because the wafer is taken out of the gas phase growing furnace after growing the layers continuously up to the active layer, damage to the active layer is reduced.

In case the current blocking layer is formed on the n side of the active layer, on the other hand, there occur many dislocations on both sides of the active layer above the window. Since the portion of dislocation contains much In content, it makes over-saturated absorption region due to higher In ratio than in the light emission region. As a result, pulsation laser can be made.

While the current blocking layer 30 is formed in the optical guide layer in the first through sixth embodiments, the present invention is not limited to this constitution. For example, the current blocking layer may be formed between the optical guide layer and the cladding layer, or inside of the cladding layer. When the current blocking layer 30 is too distant from the active layer, however, the current that has been concentrated by the current blocking layer 30 tends to spread before reaching the active layer 10. Therefore, it is preferable that the current blocking layer is located near the active layer 10 to such an extent as crystallinity of the active layer 10 is not adversely affected. It is advantageous for the purpose of achieving flat surface that the layer formed on the current blocking layer 30 is made of gallium nitride semiconductor that essentially does not contain Al. Thus it is preferable to form the current blocking layer 30 in the optical guide layer made of GaN in order to achieve the current blocking effect and flat surface, as described in conjunction with this embodiment.

The nitride semiconductor laser device according to the present invention can be packaged by either face-up mounting or face-down mounting.

EXAMPLES

Now examples of the present invention will be described.

Example 1

In Example 1, the gallium nitride semiconductor laser having the structure shown in FIG. 1 is fabricated.

(Substrate 2)

A substrate made of sapphire with the principal plane lying in the C plane having diameter of 2 inches is set in a MOVPE reaction vessel, the temperature is set to 500° C., and a buffer layer made of GaN is formed to a thickness of 200 Å by using trimethyl gallium (TMG) and ammonia (NH₃). Then temperature is raised and an undoped GaN layer is grown with a thickness of 1.5 μm. Then a plurality of stripe-shaped masks are formed on the surface of the GaN layer, and GaN is grown selectively through the windows of the masks, so as to grow GaN layer by crystal growth accompanied by lateral growth (ELOG). The mask used in selective growing is made of SiO₂, the mask measuring 15 μm in width and the window measuring 5 μm in width.

(Buffer Layer)

Then with the temperature raised to 1050° C., a buffer layer (not shown) made of AlGaN is formed with a thickness of 4 μm on the substrate 2 by using TMG (trimethyl gallium), TMA (trimethyl ammonium) and ammonia. This layer functions as the buffer layer between the n-type contact layer 4 which is formed next and the substrate 2.

(N-side Contact Layer 4)

The n-type contact layer. 4 made of AlGaN doped with Si is grown with a thickness of 4 um at a temperature of 1050° C. on the buffer layer by using TMG, TMA, ammonia, and silane gas used as an impurity gas.

(Crack Preventing Layer)

Then a crack preventing layer (not shown) made of InGaN is grown with a thickness of 0.15 μm at a temperature of 900° C. by using TMG, TMI (trimethyl indium), and ammonia.

(N-type Cladding Layer 6)

Then with the temperature set to 1050° C., after growing layer A made of undoped AlGaN with a thickness of 25 Å by using TMA, TMG and ammonia as the stock material gas, supply of TMA is stopped and silane gas is used as the impurity gas, to form layer B made of GaN doped with Si in concentration of $5 \times 10^{18}/cm^3$ with a thickness of 25 Å. These operations are repeated to form the n-type cladding layer 6 made in multi-layered film (super lattice structure) having a total thickness of 1 μm. At this time, the cladding layer can function satisfactorily when the mix ratio of Al of the undoped AlGaN is in a range from 0.05 to 0.3.

(N-side Optical Guide Layer 8)

Then at temperature of 1050° C., the n-type optical guide layer 8 made of undoped GaN is formed with a thickness of 0.15 μm by using TMG and ammonia as the stock material gas. This layer may also be doped with an n-type impurity.

(Active Layer 10)

Then with the temperature set to 900° C., a barrier layer (B) made of $In_{0.05}Ga_{0.95}N$ doped with Si in a concentration of $5 \times 10^{18}/cm^3$ is formed to a thickness of 140 Å by using TMI (trimethyl indium), TMG and ammonia as the stock material gas and silane gas as the impurity gas. Then the supply of silane gas is stopped and a well layer (W) made of undoped $In_{0.1}Ga_{0.9}N$ is grown with a thickness of 40 Å. The barrier layers (B) and the well layers (W) are stacked one on another in the order of barrier layer/well layer/barrier layer/well layer/ . . . /barrier layer/well layer/barrier layer. While the last layer may be either barrier layer or well layer, it is preferable that barrier layer is formed as the last layer. The active layer 10 is made in multiple quantum well structure (MQW) having total thickness of about 500 Å.

(Carrier Confinement Layer)

Then at a similar temperature, the p-side carrier confinement layer 11 (not shown in FIG. 1) made of AlGaN doped with Mg in a concentration of $1 \times 10^{19}/cm^3$ is formed with a thickness of 100 Å by using TMA, TMG and ammonia as the stock material gas and $Cp_2Mg$ (cyclopentadienyl magnesium) as the impurity gas. Providing this layer improves the effect of confining electrons and protects the active layer 10 from decomposition.

(The First P-side Optical Guide Layer 12a)

Then with the temperature set to 1000° C., the first p-side optical guide layer 12a made of undoped GaN is grown with a thickness of 0.075 μm by using TMG and ammonia as the stock material gas. Although the first p-side optical guide layer 12a is grown undoped, Mg concentration therein reaches $5 \times 10^{16}/cm^3$ so as to show p-type property due to the diffusion of Mg from adjacent layers such as the p-side carrier confinement layer 11 and the p-side cladding layer 14. This layer may also be grown while intentionally doping it with Mg.

(First Semiconductor Layer 22, Second Semiconductor Layer 24)

Then while maintaining the temperature at 1000° C., the first semiconductor layer 22 made of $Al_{0.2}Ga_{0.8}N$ doped with Mg is formed with a thickness of 70 Å by using TMA, TMG and ammonia as the stock material gas. With the temperature lowered to 800° C., the second semiconductor layer made of $In_{0.08}Ga_{0.92}N$ is grown with a thickness of 100 Å by using TMI, TMG and ammonia as the stock material gas.

(Current Blocking Layer 30)

Then with the temperature set to 500° C., the current blocking layer 30 made of AlN is formed with a thickness of 300 Å by using TMG and ammonia as the stock material gas. The wafer having the layers described above formed thereon is taken out of the furnace of the reaction furnace of the MOCVD apparatus and is processed to form the stripe-shaped window 32 as follows. First, the current blocking layer 30 is coated with a photo resist over substantially the entire surface thereof. After the surface is exposed to light in the pattern of the window 32, the pattern is developed using TMAH that is an alkaline solution. Since the AlN layer 30 dissolves in the alkaline developer solution, the portion of the AlN layer 30 located above the window 32 is etched and removed during the developing process (FIG. 4B). On the other hand, the second semiconductor layer made of $In_{0.08}Ga_{0.92}N$ does not dissolve in the alkaline solution and therefore functions as an etching stopper layer against etching of the AlN layer 30. Remaining resist film is removed by ashing, and the wafer is washed in acid.

Then the wafer is put into the reaction furnace of the MOCVD apparatus of which temperature is set to 1000° C. and hydrogen gas, which is a reducing gas, is blown onto the surface so as to carry out etch-back. Since the current blocking layer 30 made of AlN and the first semiconductor layer 22 having Al ratio of 0.2 have high decomposition temperatures, these layers are decomposed by the etch-back more slowly than the second semiconductor layer 24 that is made of InGaN. As a result, the portion of the second semiconductor layer 24 exposed through the window 32 is selectively removed by the etch-back process.

(Second P-side Optical Guide Layer 12b)

Then with the temperature set to 1000° C., the second p-side optical guide layer 12b made of undoped GaN is formed to a thickness of 0.075 μm by using TMG and ammonia as the stock material gas. The second p-side optical guide layer 12b is grown while doping with Mg, Since the second p-side optical guide layer 12b does not contain Al, it easily grows to form a flat surface while filling the window 32 thereby eliminating the step.

(P-side Cladding Layer 14)

Then at temperature of 1000° C., a layer made of undoped AlGaN is formed with a thickness of 25 Å. Then the supply of TMA is stopped, and a layer made of GaN doped with Mg is formed with a thickness of 25 Å by using $Cp_2Mg$. These operations are repeated 90 times so as to form the p-side cladding layer 14 of super lattice structure having total thickness of 0.45 μm (P-side Contact Layer 16)

Last, at temperature of 1000° C., the p-side contact layer 16 made of p-type GaN doped with Mg in a concentration of $1 \times 10^{20}/cm^3$ is formed with a thickness of 150 Å on the p-side cladding layer 14. The p-side contact layer 16 can be made of p-type gallium nitride semiconductor, and is preferably made of GaN doped with Mg which enables it to achieve most preferable ohmic contact with the p electrode 20. Since the p-side contact layer 16 is the layer that forms an electrode, it is desirably formed to achieve a high carrier concentration of $1 \times 10^{17}/cm^3$ or higher. When the carrier concentration is lower than $1 \times 10^{17}/cm^3$, it becomes difficult to attain satisfactory ohmic contact with the electrode. When the reaction is completed, the wafer is annealed at in nitrogen atmosphere in the reaction vessel at temperature of 700° C., so as to further decrease the resistivity of the p-type layers.

After forming the layers one on another by growing the nitride semiconductor as described above, the wafer is taken out of the reaction vessel and a protective layer (not shown) made of $SiO_2$ is formed on the surface of the p-type contact layer 16 at the top. Surface of the n-side contact layer 4 is exposed in a region where the n electrode is to be formed as shown in FIG. 1 by etching in the RIE (reactive ion etching) process. $SiO_2$ is best suited as the protective film for deep etching of the nitride semiconductor.

Then the stripe-shaped p electrode 20 made of Ni/Au is formed on the surface of the p-side contact layer 16 and the stripe shaped n electrode 18 made of Ti/Al is formed on the surface of the n-side contact layer 4. After masking part of the n electrode 18 and then the p electrode 20 and multi-layer dielectric films of $SiO_2$ and $TiO_2$ are formed, lead-out (pad) electrodes made of Ni—Ti—Au (1000 Å-1000 Å-8000 Å) are formed on the n electrode 18 and the p electrode 20. Width of the active layer 10 in this case is 200 μm (width in the direction perpendicular to the direction of the resonator), and multi-layer dielectric films of $SiO_2$ and $TiO_2$ are formed also on the resonator surface (on the reflector side). After forming the n electrode 18 and the p electrode 20, the wafer is divided into bars along the M plane of the nitride semiconductor (M plane (11-00) of GaN, etc.) in the direction perpendicular to the stripe-shaped electrode, and the bars are further divided into chips, thereby producing the laser devices. Length of the resonator is 650 μm in this case.

The laser device fabricated as described above has threshold current of 35 mA, Vf of 3.8 V, Eta of 1.3 W/A, θ (∥) of 8 deg, and θ (⊥) of 22 deg. The device demonstrates good characteristics without kink occurring until the output power reaches 80 mW.

Example 2

In Example 2, a nitride semiconductor laser device having the structure shown in FIG. 6 is fabricated. While the first semiconductor layer 22, the second semiconductor layer 24 and the current blocking layer 30 are formed in the p-side optical guide layer 12 in Example 1, these layers are formed in the n-side optical guide layer 8 in this example. After forming the first n-side optical guide layer 8a with a thickness of 0.075 μm, the first semiconductor layer 22, the second semiconductor layer 24 and the current blocking layer 30 are formed and thereafter the second n-side optical guide layer 8b is formed with a thickness of 0.075 μm. The laser device thus fabricated is a pulsation laser having threshold current of 45 mA, operating frequency of 2 GHz and RIN of –130 dB/Hz.

Example 3

In Example 3, a gallium nitride semiconductor laser having the structure shown in FIG. 7 is fabricated. Layers up to the first p-side optical guide layer 12a are formed similarly to Example 1.

(Growth Base Layer 26)

With the temperature lowered to 800° C., the growth base layer 26 made of $In_{0.1}Ga_{0.9}N$ is formed with a thickness of 50 Å by using TMI, TMG and ammonia as the stock material gas.

(Current Blocking Layer 30)

Then the temperature is set to 450° C., and the current blocking layer 30 made of $Al_{0.9}Ga_{0.1}N$ is formed with a thickness of 50 Å by using TMA and ammonia as the stock material gas. The wafer having the layers described above formed thereon is taken out of the furnace of the reaction furnace of the MOCVD apparatus and is processed to form the stripe-shaped window 32 by etching the $Al_{0.9}Ga_{0.1}N$ film 30 with an alkaline developer solution similarly to Example 1. Since the growth base layer 26 made of $In_{0.1}Ga_{0.9}N$ does not dissolve in the alkaline solution, the growth base layer 26 functions as an etching stopper layer against etching of the $Al_{0.9}Ga_{0.1}N$ layer 30.

Then the wafer is put into the reaction furnace of the MOCVD apparatus of which temperature is set to 1000° C. and hydrogen gas, which is a reducing gas, is blown onto the surface so as to carry out etch-back. Since the growth base layer 26 made of InGaN contains InN of low decomposition temperature in the mixed crystal thereof and has been grown at a low temperature, this layer decomposes easily when exposed to reducing atmosphere at a high temperature. That is, the growth base layer 26 made of $In_{0.1}Ga_{0.9}N$ is removed more easily by etch-back than the first p-side optical guide layer 12a grown from GaN at a high temperature of 1000° C. and the current blocking layer 30 made of AlN that has high decomposition temperature. Therefore, only the growth base layer 26 can be selectively removed by properly selecting the conditions of the etch-back process.

The gallium nitride semiconductor laser is fabricated similarly to Example 1 after forming the second p-side optical guide layer 12b.

The laser device fabricated as described above has oscillation wavelength of 405 nm, threshold current of 40 mA, Vf of 3.6 V, Eta of 1.2 W/A, θ (∥) of 7 deg, and θ (⊥) of 20 deg. The device demonstrates good characteristics without kink occurring until the output power reaches 80 mW.

Example 4

In Example 4, a gallium nitride semiconductor laser having the structure shown in FIG. 9 is fabricated. While the growth base layer 26 and the current blocking layer 30 are formed in the p-side optical guide layer 12 in Example 3, these layers are formed in the n-side optical guide layer 8 in this example. After forming the first n-side optical guide layer 8a with a thickness of 0.075 μm, the growth base layer 26 and the current blocking layer 30 are formed and thereafter the second n-side optical guide layer 8b is formed with a thickness of 0.075 μm. The laser device thus fabricated has threshold current of 40 mA, Vf of 3.9 V, Eta of 1.2 W/A, fÆ(_a) of 7 deg, and fÆ(_Û) of 24 deg, and demonstrates good characteristics without kink occurring until the output power reaches 80 mW.

Example 5

In Example 5, a multi-stripe laser having multiple stripe structure is fabricated. The process is basically the same as that of Example 1, except for following. In this example, after forming the device structure up to the first p-side optical guide layer using a GaN substrate, the first semiconductor layer made of $Al_{0.1}Ga_{0.9}N$ is grown with a thickness of 200 Å, the second semiconductor layer made of GaN is grown with a thickness of 100 Å, the current blocking layer made of $Al_{0.95}In_{0.01}Ga_{0.04}N$ is grown with a thickness of 200 Å and then the window was formed. Four windows each 2 μm wide were formed at 20 μm intervals. Then the second p-side optical guide layer was re-grown and the remaining device layers were formed. The multi-stripe laser having four laser elements of ridge width 2 μm formed in parallel as described above demonstrated good characteristics with threshold current of 100 mA, Eta of 1.6 W/A and Po of 200 mW.

Example 6

In Example 6, a gallium nitride semiconductor laser device having the structure shown in FIG. 10 is fabricated. Instead of the first semiconductor layer 22, the second semiconductor layer 24 and the current blocking layer 30 of Example 1, only the current blocking layer 30 is formed under the conditions described below. With other respects, the process is similar to that of Example 1.

(Current Blocking Layer 30)

With the temperature set to 500° C., the current blocking layer 30 made of AlN is formed with a thickness of 300 Å by using TMA and ammonia as the stock material gas. The wafer is then taken out of the reaction furnace of the MOCVD apparatus and is processed to form the stripe-shaped window 32 as follows. First, the current blocking layer 30 is coated with a photo resist over substantially the entire surface thereof. After the surface is exposed to light in the pattern of the window 32, the pattern is developed using TMAH that is an alkaline solution. Developing process is carried out for two minutes with the TMAH solution of 2.38% maintained at 23° C. Since the AlN layer 30 that has low crystallinity dissolves in the alkaline developer solution, the portion of the AlN layer 30 located above the window 32 is etched and removed during the developing process. On the other hand, the portion of the AlN layer that makes contact with the first p-type optical guide layer which is the base layer formed below the current blocking layer has good crystallinity and does not dissolve under the conditions described above, and therefore a portion thereof about 80 Å remains in the window (FIG. 12B).

Then the wafer is put into the reaction furnace of the MOCVD apparatus of which temperature is set to 1000° C. and hydrogen gas, which is a reducing gas, is blown onto the surface for about 10 minutes so as to carry out etch-back. The remaining film portion 30b that remains in the window 32 functions as an etching stopper layer against etch-back. After this etch-back, the remaining film portion 30b becomes 70 Å in thickness.

The laser device fabricated as described above has threshold current of 35 mA, Vf of 3.8 V, Eta of 1.3 W/A, θ (∥) of 8.5 deg, and θ (⊥) of 22.5 deg. The device demonstrates good characteristics without kink occurring until the output power reaches 80 mW.

Example 7

In Example 7, a gallium nitride semiconductor laser device having the structure shown in FIG. 13 is fabricated. While the current blocking layer 30 is formed in the p-side optical guide layer 12 in Example 6, the current blocking layer 30 is formed in the n-side optical guide layer 8 in this example. After forming the first n-side optical guide layer 8a with a thickness of 0.075 μm, the current blocking layer 30 made of AlN is formed. After forming the window 32 so that the remaining film portion about 30 Å thick remains, the second n-side optical guide layer 8b is formed with a thickness of 0.075 μm. The laser device thus fabricated is a pulsation laser that has threshold current of 40 mA, Vf of 4.0 V, Eta of 1.1 W/A, θ (∥) of 7.5 deg, and θ (⊥) of 20 deg, and demonstrates good characteristics without kink occurring until the output power reaches 80 mW.

Example 8

In Example 8, a multi-stripe laser having multiple stripe structure is fabricated. The process is basically the same as that of Example 6 except for the process described below. In this example, a GaN substrate is used and the n electrode is led out of the back surface of the GaN substrate. After forming the device structure up to the first p-side optical guide layer, the first semiconductor layer made of $Al_{0.1}Ga_{0.9}N$ is grown with a thickness of 200 Å, the second semiconductor layer made of GaN is grown with a thickness of 100 Å, the current blocking layer made of $Al_{0.95}In_{0.01}Ga_{0.04}N$ is grown with a thickness of 200 Å and then the window was formed. Four windows each 2 μm wide were formed at 20 μm intervals. Then the second p-side optical guide layer was re-grown and the remaining device layers were formed. The n electrode made of Ti/Al (100 Å/5000 Å) was formed on the back surface after polishing. The multi-stripe laser having four laser elements of ridge width 2 μm formed in parallel as described above demonstrated good characteristics with threshold current of 100 mA, Eta of 1.6 W/A and Po of 200 mW.

While the present invention has been described in full detail in conjunction with the preferred embodiments while making reference to the accompanying drawings, it will be apparent for those skilled in the art that various alterations and modifications can be made. Such alterations and modifications should be understood as included in the present invention unless they deviate from the scope of the invention that is defined by the appended

What is claimed is:

1. A nitride semiconductor laser comprising a laminate that includes an n-side semiconductor layer, an active layer and a p-side semiconductor layer, said n-side semiconductor layer or p-side semiconductor layer including a current blocking layer that is made of $In_xAl_yGa_{1-x-y}N(0 \leq x \leq 0.1, 0.5 \leq y \leq 1, 0.5 \leq x+y \leq 1)$ and has a stripe-shaped window formed therein to pass current flow, wherein said current blocking layer is formed on:
a first semiconductor layer having Al;
a second semiconductor layer formed on said first semiconductor layer, said second semiconductor layer being without Al or having lower Al ratio than that of said current blocking layer and being partly removed from the portion corresponding to the window of said current blocking layer;
wherein said current blocking layer is formed in said p-side semiconductor layer,
and wherein a semiconductor layer that fills the window of said current blocking layer has an equal or lower refractive index than that of a semiconductor layer that is in contact with the bottom surface of said first semiconductor layer.

2. The nitride semiconductor laser according to claim 1, wherein said second semiconductor layer has lower Al ratio than said first semiconductor layer.

3. The nitride semiconductor laser according to claim 1, wherein said second semiconductor layer contains In.

4. The nitride semiconductor laser according to claim 1, wherein said second semiconductor layer has an impurity and the concentration of the impurity is more than $5 \times 10^7$ $cm^{-3}$.

5. The nitride semiconductor laser according to claim 1, wherein said second semiconductor layer is amorphous or poly-crystal.

6. The nitride semiconductor laser according to claim 1, wherein the thickness of said first semiconductor layer is not less than 10 Å and not more than 300 Å.

7. The nitride semiconductor laser according to claim 1, wherein the thickness of said second semiconductor layer is not less than 10 Å and not more than 300 Å.

8. The nitride semiconductor laser according to claim 1, wherein the semiconductor layer that is in contact with the bottom surface of said first semiconductor layer serves as a light-guiding layer.

9. The nitride semiconductor laser according to claim 8, wherein said light-guiding layer is substantially without Al.

10. The nitride semiconductor laser according to claim 1, wherein said current blocking layer is formed in said p-side semiconductor layer, and wherein said first semiconductor layer is in contact with the top surface of said active layer.

11. The nitride semiconductor laser according to claim 1, wherein said current blocking layer is formed apart from side faces and/or end faces of said laminate.

12. The nitride semiconductor laser according to claim 1, wherein the thickness of said current blocking layer is not less than 100 Å and not more than 500 Å.

13. The nitride semiconductor laser according to claim 1, wherein said current blocking layer is formed in said p-side semiconductor layer.

14. The nitride semiconductor laser according to claim 1, wherein a semiconductor layer that fills the window of said current blocking layer is made of a nitride semiconductor that is substantially without Al.

15. The nitride semiconductor laser according to claim 1, wherein a semiconductor layer that fills the window of said current blocking layer serves as a light-guiding layer.

16. The nitride semiconductor laser according to claim 15, wherein said light-guiding layer is substantially without Al.

17. The nitride semiconductor laser according to claim 1, wherein a dislocation density in the region over the window of said current blocking layer is smaller than that in the region over the other portions of said current blocking layer.

18. The nitride semiconductor laser according to claim 1, wherein said current blocking layer comprises AlN.

19. The nitride semiconductor laser according to claim 1, wherein a p-side ohmic electrode is formed on said p-side semiconductor layer, said p-side ohmic electrode having a width larger than the width of the window of said current blocking layer but smaller than the total width of said current blocking layer.

20. The nitride semiconductor laser according to claim 1, wherein the length of said p-side ohmic electrode in the direction parallel to light propagation is shorter than the length of said current blocking layer.

21. The nitride semiconductor laser according to claim 1, wherein said current blocking layer has an end face in the longitudinal direction, said end face being located inward from an end face of said laminate.

22. The nitride semiconductor laser according to claim 1, wherein an end face of said laminate is a resonator surface of said nitride semiconductor laser.

23. A nitride semiconductor laser comprising a laminate that includes an n-side semiconductor layer, an active layer and a p-side semiconductor layer, said n-side semiconductor layer or p-side semiconductor layer including a current blocking layer that is made of $In_xAl_yGa_{1-x-y}N(0\leq x\leq 0.1, 0.5\leq y\leq 1, 0.5\leq x+y\leq 1)$ and has a stripe-shaped window formed therein to pass current flow,
wherein said current blocking layer is formed on:
a first semiconductor layer having Al;
a second semiconductor layer formed on said first semiconductor layer, said second semiconductor layer being without Al or having lower Al ratio than that of said current blocking layer and being partly removed from the portion corresponding to the window of said current blocking layer;
wherein said current blocking layer is formed in said p-side semiconductor layer,
and wherein a semiconductor layer that fills the window of said current blocking layer has an equal or higher impurity concentration than that of a semiconductor layer that is in contact with the bottom surface of said first semiconductor layer.

24. A nitride semiconductor laser comprising a laminate that includes an n-side semiconductor layer, an active layer and a p-side semiconductor layer, said n-side semiconductor layer or p-side semiconductor layer including a current blocking layer that is made of $In_xAl_yGa_{1-x-y}N(0\leq x\leq 0.1, 0.5\leq y\leq 1, 0.5\leq x+y\leq 1)$ and has a stripe-shaped window formed therein to pass current flow,
wherein said current blocking layer is formed on:
a first semiconductor layer having Al;
a second semiconductor layer formed on said first semiconductor layer, said second semiconductor layer being without Al or having lower Al ratio than that of said current blocking layer and being partly removed from the portion corresponding to the window of said current blocking layer;
wherein said current blocking layer is formed in said p-side semiconductor layer,
and wherein a semiconductor layer that fills the window of said current blocking layer was grown at equal or higher temperature than that of a semiconductor layer that is in contact with the bottom surface of said first semiconductor layer.

25. A method of manufacturing a nitride semiconductor laser comprising a laminate that includes an n-side semiconductor layer, an active layer and a p-side semiconductor layer, said n-side semiconductor layer or p-side semiconductor layer including a buried current blocking layer made of $In_xAl_yGa_{1-x-y}N(0\leq x0.1, 0.5\leq y\leq 1, 0.5\leq x+y\leq 1)$ and having a stripe-shaped window formed therein to pass current flow comprising:
forming a first semiconductor layer made of $In_{x1}Al_{y1}Ga_{1-x1-y1}N(0\leq x_1\leq 0.1, 0.1\leq y_1\leq 1, 0.1\leq x_1+y_1\leq 1)$ at the p side or n side of said active layer;
forming a second semiconductor layer made of $In_{x2}Al_{y2}Ga_{1-x-y2}N(0\leq x_2\leq 1, 0\leq y_2\leq 0.1, 0\leq x_2+y_2\leq 1)$ on said first semiconductor layer;
forming a current blocking layer made of $In_{x3}Al_{y3}Ga_{1-x3-y3}N(0\leq x_3\leq 0.1, 0.5\leq y_3\leq 1, 0.5\leq x_3+y_3\leq 1)$ on said second semiconductor layer;
removing a part of said current blocking layer to the depth reaching said second semiconductor layer to form a stripe-shaped window; and
removing a portion of said second semiconductor layer exposed through the window of said current blocking layer to the depth reaching said first semiconductor layer,
wherein the Al ratio $y_2$ of said second semiconductor layer satisfies the formulas of $y_2<y_1$ and $y_2<y_3$.

26. The method of manufacturing nitride semiconductor laser according to claim 25, wherein said second semiconductor layer is formed so as to decompose at a lower temperature than the temperature at which said first semiconductor layer decomposes.

27. The method of manufacturing nitride semiconductor laser according to claim 26, wherein the second semiconductor layer is formed at a lower temperature than the temperature at which said first semiconductor layer is formed.

28. The method of manufacturing nitride semiconductor laser according to claim 25, wherein said current blocking layer is partly removed by wet-etching process.

29. The method of manufacturing nitride semiconductor laser according to claim 25, further comprising forming an end face of a resonator in said laminate by RIE or cleavage.

* * * * *